US012255218B2

(12) United States Patent
Jang

(10) Patent No.: US 12,255,218 B2
(45) Date of Patent: Mar. 18, 2025

(54) IMAGE SENSORS

(71) Applicant: Samsung Electronics Co., Ltd., Suwon-si (KR)

(72) Inventor: Dong Young Jang, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 693 days.

(21) Appl. No.: 17/514,256

(22) Filed: Oct. 29, 2021

(65) Prior Publication Data

US 2022/0052084 A1  Feb. 17, 2022

Related U.S. Application Data

(63) Continuation-in-part of application No. 16/532,700, filed on Aug. 6, 2019, now abandoned.

(30) Foreign Application Priority Data

Jan. 7, 2019 (KR) ........................ 10-2019-0001561

(51) Int. Cl.
*H01L 27/146* (2006.01)
*H01L 27/148* (2006.01)

(52) U.S. Cl.
CPC .... *H01L 27/1463* (2013.01); *H01L 27/14612* (2013.01); *H01L 27/14621* (2013.01); *H01L 27/14627* (2013.01); *H01L 27/14636* (2013.01); *H01L 27/14645* (2013.01); *H01L 27/14831* (2013.01)

(58) Field of Classification Search
CPC ......... H01L 27/14636; H01L 27/14641; H01L 27/14645; H01L 27/14614; H01L 27/14603; H01L 27/14621; H01L 27/1463; H01L 27/14627; H01L 27/14831; H01L 27/14612
See application file for complete search history.

(56) References Cited

U.S. PATENT DOCUMENTS 8,120,686 B2  2/2012  Hatano et al.
8,507,962 B2  8/2013  Anderson et al.
(Continued)

FOREIGN PATENT DOCUMENTS

CN   104201182 A   12/2014
KR   100790584 B1  1/2008
(Continued)

*Primary Examiner* — Vongsavanh Sengdara
(74) *Attorney, Agent, or Firm* — Myers Bigel, P.A.

(57) ABSTRACT

An image sensor is provided. The image sensor may include a substrate including first and second surfaces opposite to each other, a device isolation layer extending through the substrate and having a surface level with the second surface of the substrate, an active region comprising first and second pixel regions spaced apart and separated from each other by the device isolation layer, a photoelectric device located in the substrate and configured to convert light into electric charges, a microlens on the first surface, a first select transistor and a first source follower transistor in the first pixel region, a second source follower transistor in the second pixel region, a first node between the first select transistor and the first source follower transistor, on the first pixel region, and a second node on one side of the first select transistor on the first pixel region.

17 Claims, 17 Drawing Sheets

(56) References Cited

U.S. PATENT DOCUMENTS

| | | |
|---|---|---|
| 9,640,571 B2 | 5/2017 | Kim et al. |
| 9,887,217 B2 | 2/2018 | Ahn et al. |
| 9,966,407 B2 | 5/2018 | Kim et al. |
| 2007/0090274 A1 | 4/2007 | Lee et al. |
| 2008/0158124 A1* | 7/2008 | Kim .................... G09G 3/3648 345/92 |
| 2016/0043132 A1* | 2/2016 | Ihara .................... H01L 27/1463 257/291 |
| 2016/0049429 A1 | 2/2016 | Lee et al. |
| 2018/0040656 A1* | 2/2018 | Jang .................... H01L 27/1464 |
| 2018/0182804 A1 | 6/2018 | Lee et al. |
| 2020/0119082 A1* | 4/2020 | Lee .................. H01L 27/14831 |
| 2020/0176500 A1* | 6/2020 | Sze .................. H01L 27/14614 |
| 2021/0074747 A1* | 3/2021 | Takahashi ......... H01L 27/14636 |
| 2021/0098519 A1* | 4/2021 | Hsu .................. H01L 27/14658 |
| 2021/0183922 A1* | 6/2021 | Chou ................ H01L 27/14689 |
| 2021/0193703 A1* | 6/2021 | Watanabe ........... H01L 27/1463 |
| 2021/0193727 A1* | 6/2021 | Asatsuma ........... H01L 27/1464 |
| 2021/0273123 A1* | 9/2021 | Yang .................. H01L 27/1464 |
| 2021/0335861 A1* | 10/2021 | Cheng ............... H01L 21/76224 |
| 2022/0199663 A1* | 6/2022 | Gao .................. H01L 27/14612 |
| 2022/0271076 A1* | 8/2022 | Chang ............... H01L 27/14616 |
| 2022/0328535 A1* | 10/2022 | Huang ................ H01L 27/1463 |
| 2023/0005981 A1* | 1/2023 | Ito .................... H01L 27/14643 |

FOREIGN PATENT DOCUMENTS

| | | |
|---|---|---|
| KR | 20160016325 A | 2/2016 |
| KR | 20160022456 A | 3/2016 |
| KR | 20160034225 A | 3/2016 |
| KR | 20170086175 A | 7/2017 |
| KR | 20180076845 A | 7/2018 |
| KR | 20180080420 A | 7/2018 |

* cited by examiner

IMAGE SENSORS

CROSS-REFERENCE TO RELATED APPLICATIONS

This application is a continuation-in-part of U.S. patent application Ser. No. 16/532,700, filed Aug. 6, 2019, which claims the benefit of priority under 35 U.S.C. § 119 to Korean Patent Application No. 10-2019-0001561, filed on Jan. 7, 2019, in the Korean Intellectual Property Office, and the entire contents of each above-identified application are incorporated by reference herein.

TECHNICAL FIELD

The present disclosure relates to image sensors.

BACKGROUND

An image sensor is a device, such as a semiconductor device, that converts an optical image into an electrical signal. Image sensors may be classified into a charge coupled device (CCD) type and a complementary metal oxide semiconductor (CMOS) type. A CMOS type image sensor may be abbreviated as a CMOS image sensor (CIS). A CIS may include a plurality of pixels arranged two-dimensionally. Each of the pixels may include a photoelectric device such as a photodiode (PD). The photoelectric device may convert incident light into an electrical signal.

Recently, increasing development within the computer industry and the communication industry, has resulted in an increasing demand for image sensors with improved performance in various fields such as digital cameras, camcorders, personal communication systems (PCS), game devices, security cameras, medical micro cameras, robots, and so on. In addition, as semiconductor devices have become more highly integrated, image sensors have also become more highly integrated.

SUMMARY

Aspects of the present disclosure provide image sensors, including more highly integrated image sensors.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to some example embodiments of the present inventive concepts, an image sensor may be provided. The image sensor may include a substrate including first and second surfaces opposite to each other, a device isolation layer extending through the substrate and having a surface level with the second surface of the substrate, an active region comprising first, and second pixel regions separated from each other by the device isolation layer, and spaced apart from each other in a first direction, a photoelectric device located in the substrate and configured to convert light into electric charges, a microlens on the first surface, a first select transistor and a first source follower transistor formed in the first pixel region, a second source follower transistor formed in the second pixel region, a first node between the first select transistor and the first source follower transistor, on the first pixel region, and a second node disposed on one side of the first select transistor on the first pixel region, wherein the first and second source follower transistor have a common gate electrode extending over the device isolation layer and the first and the second pixel regions, wherein the first node is a source/drain region of the first select transistor and the first source follower transistor, wherein the second node is a source/drain region of the first select transistor, and wherein the second node does not overlap the first node in the first direction.

According to some example embodiments of the present inventive concepts, an image sensor may be provided. The image sensor includes a substrate including first and second surfaces opposite to each other, a device isolation layer extending through the substrate and having a surface level with the second surface of the substrate, an active region comprising first to fourth pixel regions separated from each other by the device isolation layer, wherein the first pixel region spaced apart from the second pixel region in a first direction, and the first pixel region spaced apart from the third pixel region in a second direction, a microlens on the first surface, a first select transistor and a first source follower transistor disposed on the third pixel region, a second source follower transistor disposed on the fourth pixel region, a third source follower transistor disposed on the second pixel region, a first node between the first select transistor and the first source follower transistor on the third pixel region, and a second node disposed on one side of the first select transistor on the third pixel region, wherein each of the first to fourth pixel regions have a first to fourth photoelectric device located in the substrate and configured to convert light into electric charges, and a first to fourth transfer transistor on the second surface of the substrate, the first to fourth transfer transistor configured to transfer the electric charges to a first to fourth floating diffusion node, wherein the first source follower transistor and the second source follower transistor and the third source follower transistor have a common gate electrode, wherein the common gate electrode has a first portion extending over the device isolation layer and the third pixel region and the fourth pixel region, and a second portion extending over the device isolation layer and the fourth pixel region and the second pixel region, wherein the first node is a source/drain region of the first select transistor and the first source follower transistor, wherein the second node is a source/drain region of the first select transistor, and wherein the first node does not overlap the second node in the first direction.

According to some example embodiments of the present inventive concepts, an image sensor may be provided. The image sensor includes a substrate including first and second surfaces opposite to each other, a device isolation layer extending through the substrate and having a surface level with the second surface of the substrate, a first share pixel region comprising first to fourth pixel regions separated from each other by the device isolation layer, a second share pixel region comprising fifth to eighth pixel regions separated from each other by the device isolation layer, and spaced apart from the first share pixel region in a first direction, a first select transistor and a first source follower transistor disposed on the third pixel region, and a second select transistor and a second source follower transistor disposed on the fourth pixel region, wherein the second select transistor extends over device isolation layer, the fourth pixel region and the seventh pixel region, wherein each of the first to eighth pixel regions have photoelectric device located in the substrate and configured to convert light into electric charges, and a transfer transistor on the second surface of the substrate, the transfer transistor configured to transfer the electric charges to a floating diffusion node, wherein the first source follower transistor and the second source follower transistor have a first common gate electrode extending over the device isolation layer and the third pixel region and the fourth pixel region, and wherein a gate electrode of the second select transistor and the first common gate electrode are disposed at a same vertical level from the substrate.

BRIEF DESCRIPTION OF THE DRAWINGS

Aspects and features of the present disclosure, including those discussed above, will become more apparent by describing in detail some example embodiments thereof with reference to the attached drawings, in which.

DETAILED DESCRIPTION

Hereinafter, an image sensor according to some embodiments of the present disclosure will be described with reference to FIGS. 1 to 5B.

Figure 1:
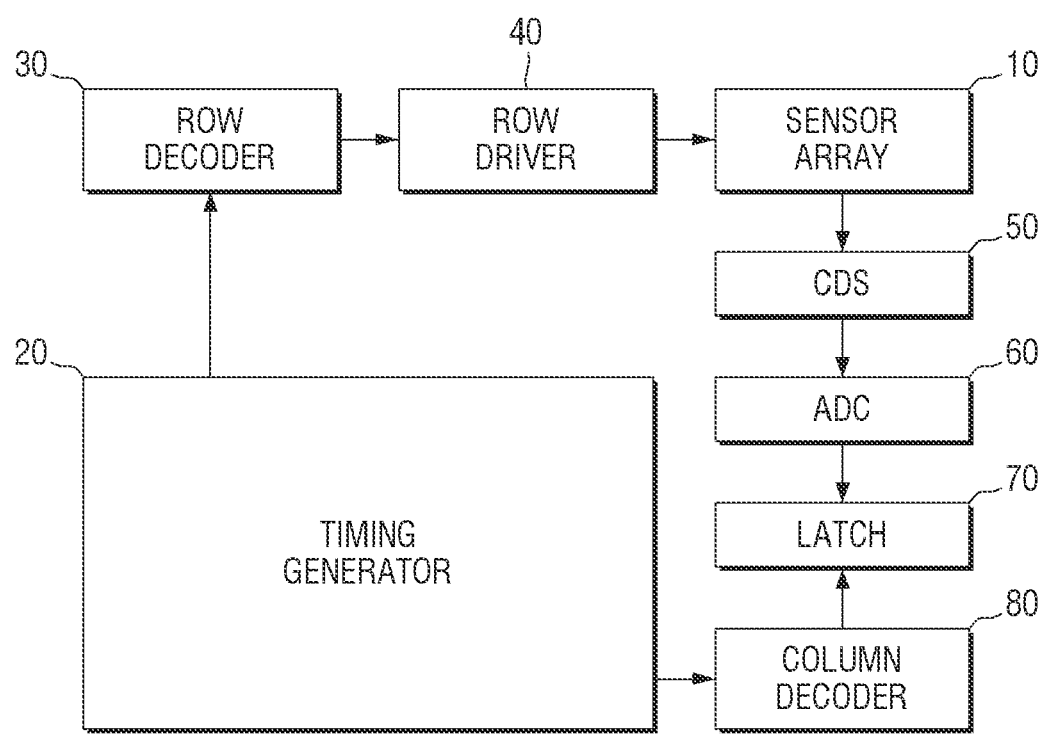
FIG. 1 is a block diagram illustrating an image sensor according to some embodiments of the present disclosure.

FIG. 1 is a block diagram illustrating an image sensor according to some embodiments of the present disclosure.

Referring to FIG. 1, an image sensor according to some embodiments of the present disclosure includes a sensor array 10 in which pixels including photoelectric devices are arranged in two dimensions, a timing generator 20, a row decoder 30, a row driver 40, a correlated double sampler (CDS) 50, an analog-to-digital converter (ADC) 60, a latch 70, and a column decoder 80. Other components may be present in the image sensor of FIG. 1, but discussion thereof is omitted herein for brevity.

The sensor array 10 includes a plurality of unit pixels arranged two-dimensionally. The plurality of unit pixels may convert an optical image into an electrical output signal. The sensor array 10 is driven by receiving a plurality of drive signals such as a row select signal, a reset signal, and a charge transfer signal from the row driver 40. Further, the converted electrical output signal is provided to the correlated double sampler 50 through a vertical signal line.

The timing generator 20 provides a timing signal and a control signal to the row decoder 30 and the column decoder 80.

The row driver 40 provides a plurality of drive signals configured to drive the plurality of unit pixels to the sensor array 10 having active pixels according to the decoded result in the row decoder 30. Generally, when unit pixels are arranged in a matrix form, a drive signal is provided for each row.

The correlated double sampler 50 receives and holds and samples the output signal formed on the active pixel sensor array 10 through the vertical signal line. That is, a specific noise level and a signal level based on the output signal are doubly sampled to output a difference level corresponding to a difference between the noise level and the signal level.

The analog-to-digital converter 60 converts an analog signal corresponding to the difference level into a digital signal and outputs the digital signal.

The latch unit 70 latches the digital signal and the latched signal is sequentially outputted to an image signal processing unit (not shown in FIG. 1) in accordance with the decoding result in the column decoder 80.

Figure 2:
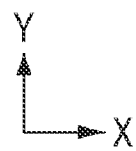
FIG. 2 is a conceptual diagram explaining a sensor array of an image sensor according to some embodiments of the present disclosure.

FIG. 2 is a conceptual diagram explaining a sensor array of an image sensor according to some embodiments of the present disclosure.

Referring to FIG. 2, the sensor array 10 may be arranged such that a plurality of pixels P1 to P24 are aligned in a plurality of rows and columns. Although FIG. 2 shows 24 pixels in four rows and six columns, this is merely an example, and the present embodiment is not limited thereto. That is, the number of rows, columns and pixels of the sensor array 10 may vary.

The plurality of pixels P1 to P24 may be aligned in a first direction X and a second direction Y. The second direction Y may be a direction intersecting the first direction X. For example, the second direction Y may be a direction perpendicular to the first direction X. The first direction X may be a row direction in which a plurality of pixels P1 to P24 are aligned. The second direction Y may be a column direction in which a plurality of pixels P1 to P24 are aligned.

The plurality of pixels P1 to P24 may constitute a plurality of share pixels SP1 to SP6. Specifically, the first to fourth pixels P1 to P4 may constitute a first share pixel SP1 and the fifth to eighth pixels P5 to P8 may constitute a second share pixel SP2. The ninth to twelfth pixels P9 to P12 may constitute a third share pixel SP3 and the thirteenth to sixteenth pixels P13 to P16 may constitute a fourth share pixel SP4. The seventeenth to twentieth pixels P17 to P20 may constitute a fifth share pixel SP5 and the twenty-first to twenty-fourth pixels P21 to P24 may constitute a sixth share pixel SP6.

The first to third share pixels SP1 to SP3 may be sequentially arranged in the first direction X. The fourth to sixth share pixels SP4 to SP6 may be sequentially arranged in the first direction X. In other words, the first to third share pixels SP1 to SP3 may be sequentially arranged in a first row in the first direction X, and the fourth to sixth share pixels SP4 to SP6 may be sequentially arranged in a second row in the first direction X. The first to third share pixels SP1 to SP3 and the fourth to sixth share pixels SP4 to SP6 may be aligned in the second direction Y. Specifically, the first share pixel SP1 and the fourth share pixel SP4 are aligned in the second direction Y, and the second share pixel SP2 and the fifth share pixel SP5 are aligned in the second direction Y. In addition, the third share pixel SP3 and the sixth share pixel SP6 may be aligned in the second direction Y. In other words, the first and second share pixels SP1 and SP2 may be aligned in a first column in the second direction Y, the third and fourth share pixels SP3 and SP4 may be aligned in a second column in the second direction Y, and the fifth and sixth share pixels SP5 and SP6 may be aligned in a third column in the second direction Y.

The first pixel P1 and the second pixel P2 in the first share pixel SP1 are aligned with each other in the first direction X, and the third pixel P3 and the fourth pixel P4 are aligned with each other in the first direction X. The first pixel P1 and the third pixel P3 are aligned with each other in the second direction Y, and the second pixel P2 and the fourth pixel P4 are aligned with each other in the second direction Y. In other words, the first to fourth pixels P1 to P4 of the first share pixel SP1 may be arranged in a grid, with at least two pixels (e.g., first pixel P1 and second pixel P2) aligned in the first direction X, and at least two pixels (e.g., first pixel P1 and third pixel P3) aligned in the second direction Y.

Figure 3:
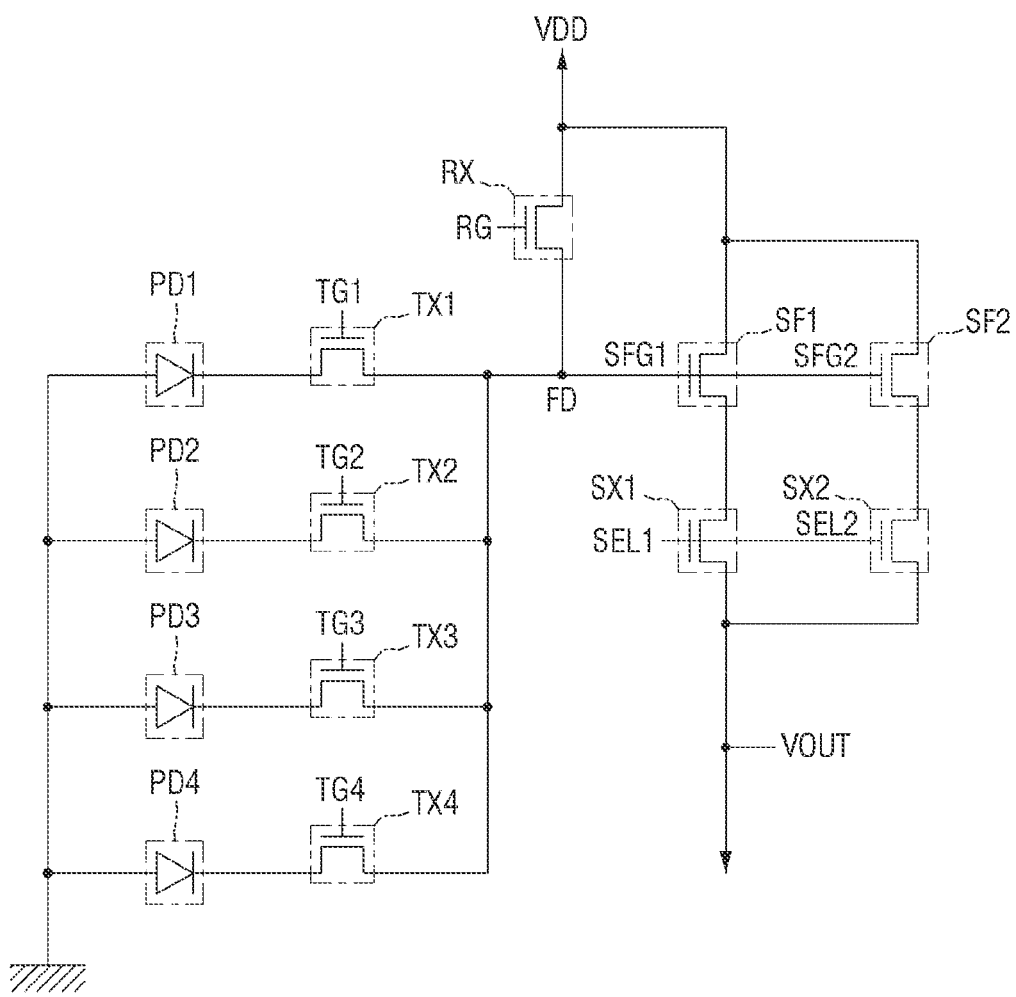
FIG. 3 is an equivalent circuit diagram of share pixels of an image sensor according to some embodiments of the present disclosure.

FIG. 3 is an equivalent circuit diagram of share pixels of an image sensor according to some embodiments of the present disclosure. FIG. 3 is an equivalent circuit diagram of the first share pixel SP1 of FIG. 2.

Referring to FIG. 3, the first share pixel SP1 includes first to fourth photoelectric devices PD1 to PD4, first to fourth transfer transistors TX1 to TX4, a reset transistor RX, a first source follower transistor SF1, a second source follower transistor SF2 and first and second select transistors SX1 and SX2.

The first to fourth photoelectric devices PD1 to PD4 absorb incident light and accumulate charges corresponding to the amount of light. A photodiode, a phototransistor, a photogate, a pinned photodiode or a combination thereof may be applied to the first to fourth photoelectric devices PD1 to PD4, with photodiodes illustrated in FIG. 3 as examples.

The first to fourth photoelectric devices PD1 to PD4 are coupled respectively to the first to fourth transfer transistors TX1 to TX4, which are configured to transfer the accumulated charges to a floating diffusion node FD. Specifically, the first photoelectric device PD1 is coupled to the first transfer transistor TX1, and the second photoelectric device PD2 is coupled to the second transfer transistor TX2. The third photoelectric device PD3 is coupled to the third transfer transistor TX3, and the fourth photoelectric device PD4 is coupled to the fourth transfer transistor TX4.

Each of the first to fourth transfer transistor TX1 to TX4 includes a respective first to fourth transfer gate electrode TG1 to TG4. The first transfer transistor TX1 includes a first transfer gate electrode TG1, and the second transfer transistor TX2 includes a second transfer gate electrode TG2. The third transfer transistor TX3 includes a third transfer gate electrode TG3, and the fourth transfer transistor TX4 includes a fourth transfer gate electrode TG4.

The first transfer gate electrode TG1 is included in the first pixel P1 and the second transfer gate electrode TG2 is included in the second pixel P2. The third transfer gate electrode TG3 is included in the third pixel P3, and the fourth transfer gate electrode TG4 is included in the fourth pixel P4.

The floating diffusion node FD is a region for converting a charge into a voltage. Since the floating diffusion node FD has a parasitic capacitance, charges are stored cumulatively.

The first source follower transistor SF1 amplifies a change in the electric potential of the floating diffusion node FD which receives the charges accumulated in each of the first to fourth photoelectric devices PD1 to PD4, and outputs it to an output line VOUT through the first select transistor SX1. The second source follower transistor SF2 amplifies a change in the electric potential of the floating diffusion node FD which receives the charges accumulated in each of the first to fourth photoelectric devices PD1 to PD4, and outputs it to an output line VOUT through the second select transistor SX2.

That is, the first source follower transistor SF1 includes a first source follower gate electrode SFG1. The second source follower transistor SF2 includes a second source follower gate electrode SFG2. The first and second source follower gate electrode SFG1, SFG2 receives the voltage of the floating diffusion node FD as a signal and amplifies the signal. In some embodiments, the first source follower gate electrode SFG1 and the second source follower gate electrode SFG2 are shared.

The first and second source follower transistor SF1, SF2 may be disposed in only one first share pixel SP1. The first source follower transistor SF1 and the second source follower transistor SF2 may take charge of the amplification of the first to fourth pixels P1 to P4.

The reset transistor RX periodically resets the floating diffusion node FD. The reset transistor RX may be formed of one MOS transistor driven by a bias provided by a reset gate electrode RG that applies a predetermined bias (i.e., a reset signal). When the reset transistor RX is turned on by the bias provided by the reset gate electrode RG, a predetermined electric potential, e.g., a power supply voltage VDD, provided to the drain of the reset transistor RX is applied to the floating diffusion node FD.

Only one reset transistor RX may be arranged in the first share pixel SP1. The reset transistor RX may be configured to reset each of the first to fourth pixels P1 to P4. That is, the first to fourth pixels P1 to P4 may share one reset transistor RX.

The first select transistor SX1 and the second select transistor SX2 may select a pixel to be read on a row basis. Each of the first select transistor SX1 and the second select transistor SX2 may be formed of one MOS transistor driven by a bias (i.e., a row select signal) provided by a first select gate electrode SEL1 and a second select gate electrode SEL2. When the first select transistor SX1 is turned on by a bias provided by the first select gate electrode SEL1, the output of the first source follower transistor SF1 may be provided to the drain of the first select transistor SX1 and is transferred to the output line VOUT. When the second select transistor SX2 is turned on by a bias provided by the second select gate electrode SEL2, the output of the second source follower transistor SF2 may be provided to the drain of the second select transistor SX2 and is transferred to the output line VOUT.

The first select transistor SX1 and the second select transistor SX2 may be arranged only in the first share pixel SP1. The first select transistor SX1 and the second select transistor SX2 may be configured to select each of the first to fourth pixels P1 to P4. That is, the first to fourth pixels P1 to P4 may share two of the first select transistor SX1 and the second select transistor SX2.

The first select transistor SX1 includes the first select gate electrode SEL1, and the second selection transistor SX2 includes the second select gate electrode SEL2.

The circuit structure of the first share pixel SP1 described above may be the same as the circuit structure of the other share pixels, i.e., the second share pixel SP2 to the sixth share pixel SP6, of FIG. 2. For simplicity of description, a description of the circuit structure of the second to fifth share pixels SP2 to SP6 will be omitted.

Figure 4:
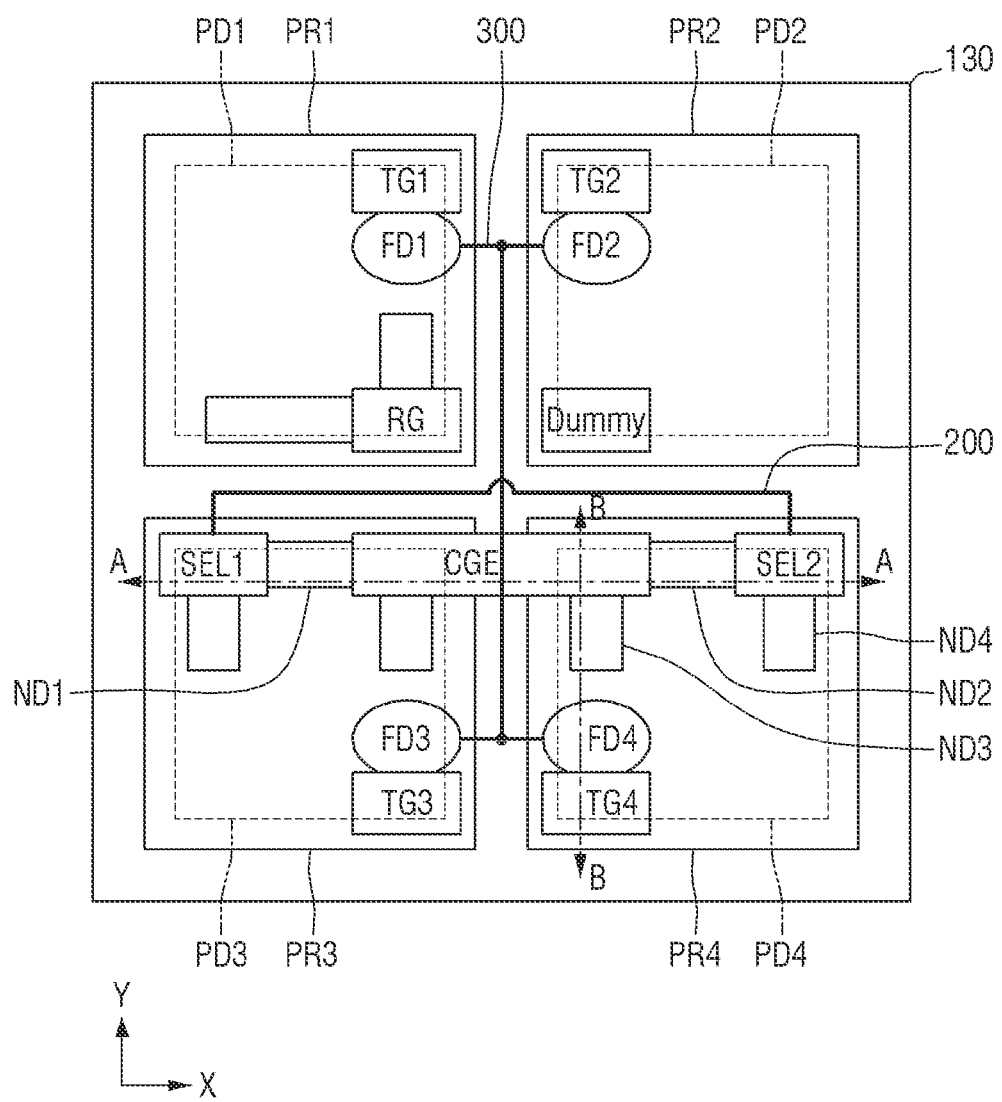
FIG. 4 is a layout diagram of share pixels of an image sensor according to some embodiments of the present disclosure.

FIG. 4 is a layout diagram of share pixels of an image sensor according to some embodiments of the present disclosure. FIG. 4 is a layout of the first share pixel SP1. The second to fourth share pixels SP2 to SP6 of FIG. 2 may have the same layout as the layout of the first share pixels SP1. For simplicity of description, a description of the second to fourth share pixels SP2 to SP6 is omitted.

Referring to FIG. 4, an image sensor according to some embodiments of the present disclosure includes a first pixel region PR1, a second pixel region PR2, a third pixel region PR3, a fourth pixel region PR4, a device isolation layer 130, first to fourth transfer gate electrodes TG1 to TG4, first to fourth floating diffusion nodes FD1 to FD4, a reset gate electrode RG, a dummy gate electrode Dummy, a common gate electrode CGE, a first select gate electrode SEL1, a second select gate electrode SEL2, a first wiring 300 and a second wiring 200.

The first share pixel SP1 of FIG. 2 includes first to fourth pixels P1 to P4. The first to fourth pixels P1 to P4 may include the first pixel region PR1, the second pixel region PR2, the third pixel region PR3 and the fourth pixel region PR4, respectively. The first pixel region PR1, the second pixel region PR2, the third pixel region PR3 and the fourth pixel region PR4 may be separated from each other by the device isolation layer 130.

The first pixel region PR1 and the second pixel region PR2 are aligned with each other in the first direction X, and the third pixel region PR3 and the fourth pixel region PR4 are aligned with each other in the first direction X. The first pixel region PR1 and the third pixel region PR3 are aligned with each other in the second direction Y, and the second pixel region PR2 and the fourth pixel region PR4 are aligned with each other in the second direction Y.

Each of the first to fourth pixel regions PR1, PR2, PR3, PR4 comprises the first to fourth photoelectric devices PD1, PD2, PD3, PD4 located in the substrate 100. The first pixel region PR1 includes a first photoelectric device PD1. The second pixel region PR2 includes a second photoelectric device PD2. The third pixel region PR3 includes a third photoelectric device PD3. The fourth pixel region PR4 includes a fourth photoelectric device PD4.

The device isolation layer 130 may completely separate the first pixel region PR1, the second pixel region PR2, the third pixel region PR3 and the fourth pixel region PR4 from each other. The device isolation layer 130 may electrically isolate the first pixel region PR1, the second pixel region PR2, the third pixel region PR3 and the fourth pixel region PR4.

The first transfer gate electrode TG1 may be located in the first pixel region PR1 and the second transfer gate electrode TG2 may be located in the second pixel region PR2. The third transfer gate electrode TG3 may be located in the third pixel region PR3, and the fourth transfer gate electrode TG4 may be located in the fourth pixel region PR4.

The first to fourth floating diffusion nodes FD1 to FD4 may correspond to the floating diffusion node FD of FIG. 3. The first to fourth floating diffusion nodes FD1 to FD4 may be disposed in the first pixel region PR1, the second pixel region PR2, the third pixel region PR3 and the fourth pixel region PR4, respectively. The first to fourth floating diffusion nodes FD1 to FD4 may be connected to each other. The first to fourth floating diffusion nodes FD1 to FD4 may be coupled to the first to fourth transfer transistors TX1 to TX4, respectively.

Accordingly, the timing at which the floating diffusion node FD of FIG. 3 is used may be changed depending on whether the first to fourth transfer gate electrodes TG 1 to TG 4 are operated. Accordingly, the first to fourth pixels P1 to P4 of FIG. 2 may use the floating diffusion nodes FD connected to each other, respectively.

The reset gate electrode RG may be located in the first pixel region PR1. The reset gate electrode RG may be symmetrically located with the dummy gate electrode Dummy and at least a portion the common gate electrode CGE. For example, the reset gate electrode RG and the dummy gate electrode Dummy may be located at symmetric positions relative to the device isolation layer 130 within the first pixel region PR1 and the second pixel region PR2. The reset gate electrode RG may be configured to reset the first to fourth floating diffusion nodes FD1 to FD4 of the first to fourth pixels P1 to P4 of FIG. 2.

The dummy gate electrode Dummy may be located in the second pixel region PR2. The dummy gate electrode Dummy may be formed for the uniformity of the reset gate electrode RG and the common gate electrode CGE. Therefore, the dummy gate electrode Dummy may be formed at a position symmetrical to the reset gate electrode RG in the first direction X. The dummy gate electrode Dummy may not actually function at all.

The common gate electrode CGE includes a first source follower gate electrode SFG1 and a second source follower gate electrode SFG2, in FIG. 3. The common gate electrode CGE is a common gate of the first source follower transistor SF1 and the second source follower transistor SF2. Thus, the first source follower transistor SF1 and the second source follower transistor SF2 share the common gate electrode CGE.

The common gate electrode CGE may be formed over the third pixel region PR3 and the fourth pixel region PR4. The common gate electrode CGE may be formed on the device isolation layer 130 as well as the third pixel region PR3 and the fourth pixel region PR4. That is, the common gate electrode CGE may also be formed on the device isolation layer 130 between the third pixel region PR3 and the fourth pixel region PR4.

The common gate electrode CGE may extend in the first direction X. The common gate electrode CGE may be connected to the first to fourth floating diffusion nodes FD1 to FD4, for example via the first wiring 300.

The first select gate electrode SEL1 may be located in the third pixel region PR3. The second select gate electrode SEL2 may be located in the fourth pixel region PR4. The first select gate electrode SEL1 and the second select gate electrode SEL2 may select a pixel to be read out from among the first to fourth pixels P1 to P4.

The first wiring 300 may connect a first floating diffusion node FD1, a second floating diffusion node FD2, a third floating diffusion node FD3 and a fourth floating diffusion node FD4 to the common gate electrode CGE. The first wiring 300 may be disposed at an upper level higher than the first floating diffusion node FD1, the second floating diffusion node FD2, the third floating diffusion node FD3 and the fourth floating diffusion node FD4 and the common gate electrode CGE.

The second wiring 200 may connect the first select gate electrode SEL1 and the second select gate electrode SEL2. Accordingly, the first select gate electrode SEL1 and the second select gate electrode SEL2 may be controlled to the same gate voltage.

Figure 5A:
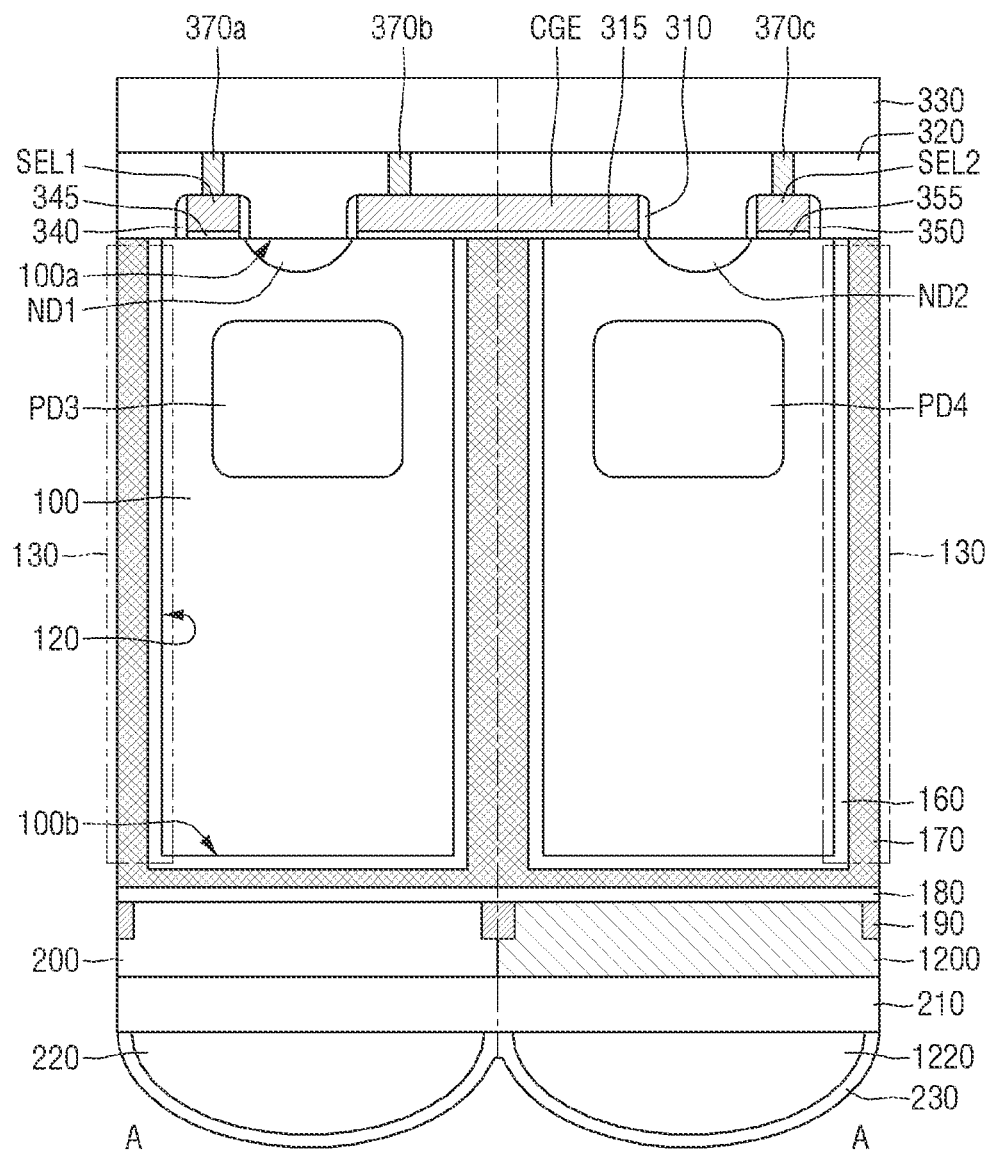
FIG. 5A is a cross-sectional view taken along line A-A of FIG. 4.
Figure 5B:
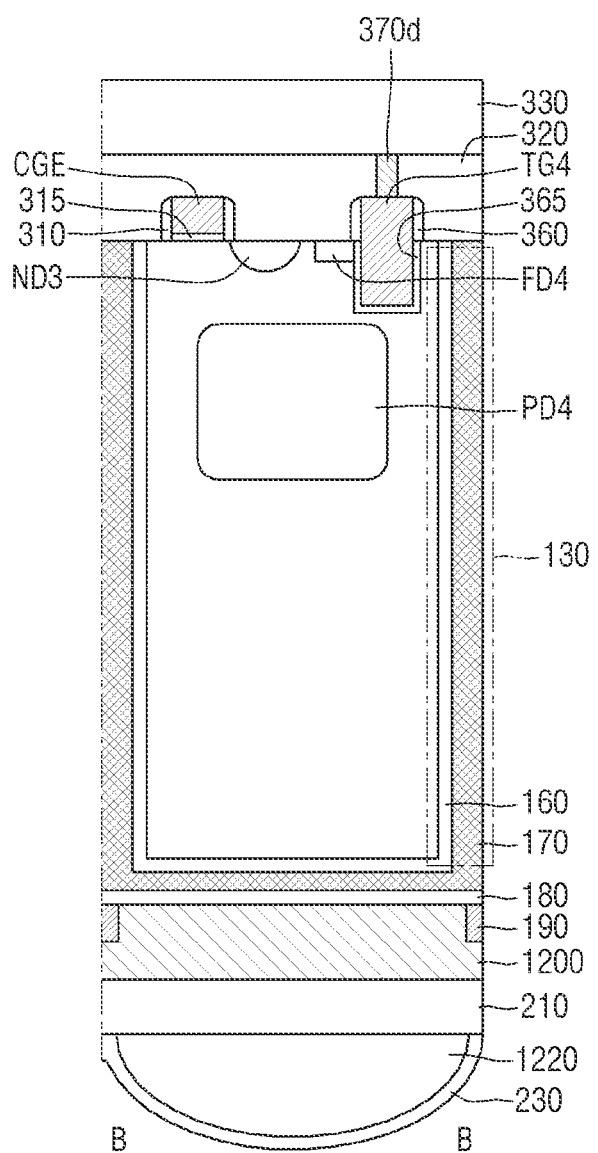
FIG. 5B is a cross-sectional view taken along line B-B of FIG. 4.

FIG. 5A is a cross-sectional view taken along line A-A of FIG. 4. FIG. 5B is a cross-sectional view taken along line B-B of FIG. 4.

Referring to FIGS. 5A and 5B, an image sensor according to the present embodiment includes a substrate 100, a third photoelectric device PD3, a fourth photoelectric device PD4, a device isolation layer 130, a liner 160, a filling layer 170, a first planarization layer 180, a side antireflection layer 190, 200, a first color filter 200, a second color filter 1200, a second planarization layer 210, a first microlens 220, a second microlens 1220, a protective layer 230, a first interlayer insulating layer 320, a first select gate electrode SEL1, a second select gate electrode SEL2, a first select spacer 340, a second select spacer 350, a first select gate insulating film 345, a second select gate insulating film 355, a common gate electrode CGE, a source follower spacer 310, a source follower gate insulating film 315, a fourth transfer gate electrode TG4, a fourth transfer gate insulating film 365, a fourth transfer spacer 360, a first node ND1, a second node ND2, third node ND3, a first contact 370a, a second contact 370b, a third contact 370c, a fourth contact 370d and a second interlayer insulating layer 330.

The substrate 100 includes a first surface 100a and a second surface 100b opposite to each other. The first surface 100a of the substrate 100 may be the front side of the substrate 100 and the second surface 100b of the substrate 100 may be the back side of the substrate 100. However, the present disclosure is not limited thereto.

The substrate 100 may be configured by using, for example, a P-type or N-type bulk substrate, a P-type or N-type epitaxial layer grown on a P-type bulk substrate, or a P-type or N-type epitaxial layer grown on an N-type bulk substrate. The substrate 100 may be a substrate such as an organic plastic substrate in addition to a semiconductor substrate.

The substrate 100 may be divided by the device isolation layer 130. The region of the substrate 100 divided by the device isolation layer 130 may be an active region. For example, the first pixel region PR1, the second pixel region PR2, the third pixel region PR3 and the fourth pixel region PR4 of FIG. 4 may be active regions.

A third photoelectric device PD3 and a fourth photoelectric device PD4, for example, a photodiode, are formed in the substrate 100 of the active region. The third photoelectric device PD3 and the fourth photoelectric device PD4 may be formed in proximity to the first surface 100a of the substrate 100, but the present disclosure is not limited thereto.

The third photoelectric device PD3 and the fourth photoelectric device PD4 may be a photodiode, a phototransistor, a photogate, a pinned photodiode, or a combination thereof as described above.

The device isolation layer 130 may be formed in the substrate 100. The device isolation layer 130 may define an active region in the substrate 100. The device isolation layer 130 may be formed at the edge of each active region. Each active region may be defined as a closed space by the device isolation layer 130. The planar cross-sectional shape of the device isolation layer 130 may be a closed curve in the form of a loop.

The device isolation layer 130 may be formed in a boundary isolation trench 120. The boundary isolation trench 120 may be formed in the substrate 100 by etching in a depth direction. The boundary isolation trench 120 may be formed on the second surface 100b of the substrate 100 and extend in a direction of the first surface 100a. The boundary isolation trench 120 may reach the second surface 100b of the substrate 100 and completely penetrate the substrate 100.

The width of the boundary isolation trench 120 may be constant as shown in FIG. 5A. Alternatively, the boundary isolation trench 120 may have a tapered shape such that its width becomes narrower toward the first surface 100a. However, the present disclosure is not limited thereto.

The device isolation layer 130 may be filled with the liner 160 to be described later and the filling layer 170 formed on the liner 160 as shown in the drawing.

Alternatively, the device isolation layer 130 may be filled with a single material. In this case, the device isolation layer 130 may include at least one of silicon oxide, silicon nitride, silicon oxynitride and a low-k material having a lower dielectric constant than silicon oxide.

The low-k material may include, for example, Flowable Oxide (FOX), Tonen SilaZene (TOSZ), Undoped Silica Glass (USG), Borosilica Glass (BSG), PhosphoSilica Glass (PSG), BoroPhosphoSilica Glass (BPSG), Plasma Enhanced Tetra Ethyl Ortho Silicate (PETEOS), Fluoride Silicate Glass (FSG), Carbon Doped silicon Oxide (CDO), Xerogel, Aerogel, Amorphous Fluorinated Carbon, Organo Silicate Glass (OSG), Parylene, bis-benzocyclobutenes (BCB), SiLK, polyimide, a porous polymeric material, or a combination thereof, but the present disclosure is not limited thereto.

The liner 160 may be formed on the second surface 100b of the substrate 100 and on the surface (side surface) of the boundary isolation trench 120. The liner 160 may be formed on the entire surface or a partial surface of the second surface 100b of the substrate 100.

The liner 160 may be formed in P+ type when the third photoelectric device PD3 and the fourth photoelectric device PD4 formed in the pixel region are N type. The liner 160 may reduce a dark current by reducing electron-hole pairs (EHP) generated thermally on the second surface 100b of the substrate 100. In some cases, the liner 160 may be omitted.

The liner 160 may include, for example, a metal oxide film or a metal nitride film, and the metal may be selected from the group consisting of hafnium (Hf), aluminum (Al), zirconium (Zr), tantalum (Ta) and titanium (Ti). The liner 160 may include at least one of La, Pr, Ce, Nd, Pm, Sm, Eu, Gd, Tb, Dy, Ho, Tm, Yb, Lu and Y. Further, the liner 160 may be formed of a hafnium oxynitride film or an aluminum oxynitride film.

Although the liner 160 is shown as a single layer in the drawing, it may be a stacked structure in which two or more layers formed of the same or different materials are combined.

The filling layer 170 may be formed on the liner 160. The filling layer 170 may completely fill the boundary isolation trench 120. The filling layer 170 may prevent reflection of light incident from the outside. The filling layer 170 may include a material having a refractive index different from that of the liner 160. For example, the filling layer 170 may be formed of an insulating film such as a silicon oxide film, a silicon nitride film, a silicon oxynitride film, a resin, a combination thereof, or a laminate thereof.

The double layer structure of the liner 160 and the filling layer 170 may have an antireflection function due to different refractive indexes. Therefore, reflection of light incident on the second surface 100b of the substrate 100 can be prevented.

The material/thickness of the filling layer 170 may be changed according to the wavelength of light used in a photolithography process. For example, a silicon oxide film having a thickness of about 50 to 200 Å and a silicon nitride film having a thickness of about 300 to 500 Å may be stacked and used as the filling layer 170. However, the present disclosure is not limited thereto.

The first planarization layer 180 may be formed below the filling layer 170. The first planarization layer 180 may include at least one of, for example, a silicon oxide-based material, a silicon nitride-based material, a resin, or a combination thereof.

The first planarization layer 180 may fill the lower surface of the device isolation layer 130 of the filling layer 170 and the liner 160 in a flat manner when the lower surface thereof is uneven.

The first planarization layer 180 may include at least one of a silicon oxide-based material, a silicon nitride-based material, a resin and a combination thereof. As the first planarization layer 180, for example, a silicon oxide film having a thickness of about 3000 to 8000 Å may be used. However, the present disclosure is not limited thereto.

The first color filter 200 may be formed below the first planarization layer 180. The first color filter 200 may filter the remaining wavelength band of incident light except for a specific color. Accordingly, the light having passed through the first color filter 200 may be a specific color light. The light passing through the first color filter 200 may pass through upper structures and reach the third photoelectric device PD3. The third photoelectric device PD3 may generate a current by incident light.

The first color filter 200 may be an infrared ray filter, rather than a visible ray filter. In this case, the first color filter 200 may pass only light in an infrared region.

The second color filter 1200 may also be formed below the first planarization layer 180. The second color filter 1200 may also filter the remaining wavelength band of incident light except for a specific color. The specific color of the second color filter 1200 may be a different color than the specific color of the first color filter 200. However, in an image sensor according to some embodiments of the present disclosure, the first color filter 200 and the second color filter 1200 may be filters for the same color.

The light having passed through the second color filter 1200 may pass through the upper structures and reach the fourth photoelectric device PD4. The fourth photoelectric device PD4 may generate a current by incident light.

The second color filter 1200 may be an infrared ray filter, rather than a visible ray filter. In this case, the second color filter 1200 may pass only light in an infrared region.

The side antireflection layer 190 may be formed below the first planarization layer 180. The side antireflection layer 190 may cover a part of the first planarization layer 180. The side antireflection layer 190 may overlap the device isolation layer 130 in the vertical direction. That is, the side antireflection layer 190 may be disposed at the edge of the active region.

The side antireflection layer 190 may be disposed on the side surface of the first color filter 200. Specifically, the first color filter 200 may cover the side surface and the lower surface of the side antireflection layer 190. That is, the height of the lower surface of the side antireflection film 190 may be higher than the height of the lower surface of the first color filter 200.

The side antireflection layer 190 may prevent incident light passing through the first color filter 200 and the second color filter 1200 from being reflected or scattered laterally. That is, photons reflected or scattered at the interface between the first color filter 200 and the second color filter 1200 and the first planarization layer 180 can be prevented from moving to other active regions. Since the side antireflection layer 190 acts at the interface as described above, it may cover only a part of the side surfaces of the first color filter 200 and the second color filter 1200.

The side antireflection layer 190 may include a metal. The side antireflection layer 190 may include at least one of tungsten (W), aluminum (Al) and copper (Cu), for example.

The second planarization layer 210 may be formed in a flat manner below the first color filter 200 and the second color filter 1200. The second planarization layer 210 may include at least one of, for example, a silicon oxide-based material, a silicon nitride-based material, a resin and a combination thereof. Although the second planarization layer 210 is illustrated as a single layer, it is merely exemplary, and the present disclosure is not limited thereto.

Although it is illustrated in FIGS. 5A and 5B that the second planarization layer 210 and the first planarization layer 180 are formed below and above the first color filter 200 and the second color filter 1200, respectively, the present disclosure is not limited thereto. For example, a planarization layer may be formed only below the first color filter 200 and the second color filter 1200, and a planarization layer may be formed only above the first color filter 200 and the second color filter 1200. Alternatively, there may be no planarization layer both above and below the first color filter 200 and the second color filter 1200.

The first microlens 220 and the second microlens 1220 may be formed below the second planarization layer 210. The first microlens 220 and the second microlens 1220 may have a downward convex shape as illustrated. The convex shape of the first microlens 220 and the second microlens 1220 may concentrate incident light on the active region.

The first microlens 220 and the second microlens 1220 may be made of an organic material such as Photo Resist (PR). However, the present disclosure is not limited thereto, and the first microlens 220 and the second microlens 1220 may be formed of an inorganic material.

The formation of the first microlens 220 and the second microlens 1220 using an organic material may be performed, for example, by forming an organic material pattern below the second planarization layer 210 and performing a thermal process. The organic material pattern may be changed into the first microlens 220 and the second microlens 1220 by the thermal process.

The protective layer 230 may be formed to have a predetermined thickness along the surfaces of the first microlens 220 and the second microlens 1220. The protective layer 230 may be an inorganic oxide film. For example, a silicon oxide film ($SiO_2$), a titanium oxide film ($TiO_2$), a zirconium oxide film ($ZrO_2$), a hafnium oxide film ($HfO_2$), a laminated film thereof and/or a combination film thereof may be used.

In particular, Low Temperature Oxide (LTO), which is a kind of silicon oxide film, may be used as the protective layer 230. Since LTO is fabricated at a low temperature (about 100° C. to 200° C.), damage to underlying layers can be reduced. In addition, since LTO is amorphous, its surface is smooth and the reflection, refraction and scattering of the incident light can be minimized.

Since the first microlens 220 and the second microlens 1220 are made of an organic material, they may be vulnerable to external impacts. Accordingly, the protective layer 230 protects the first microlens 220 and the second microlens 1220 from external impacts. In addition, there may be a slight space between neighboring microlenses, and the protective layer 230 may fill such a space.

When the space between the neighboring microlenses and the first microlens 220 and the second microlens 1220 is filled, the condensing efficiency of incident light can be improved. This is because the reflection, refraction and scattering of incident light reaching the space between the neighboring microlenses and the first microlens 220 and the second microlens 1220 can be reduced.

The first planarization layer 180, the second planarization layer 210, the first color filter 200, the second color filter 1200, the first microlens 220, the second microlens 1220 and the protective layer 230 may be formed in a downward direction of the second surface 100*b* of the substrate 100. Hereinafter, constituent elements formed in an upward direction of the first surface 100*a* of the substrate 100 will be described.

The common gate electrode CGE may be formed on the active region of the first surface 100*a* of the substrate 100 and on the device isolation layer 130. The common gate electrode CGE may extend over the two active regions (the third pixel region PR3 and the fourth pixel region PR4). The common gate electrode CGE may be electrically connected to the second contact 370*b*.

The source follower spacer 310 may be formed on a side surface of the source follower gate insulating film 315. The source follower spacer 310 may include oxide, nitride and/or oxynitride.

The source follower gate insulating film 315 may be formed on a bottom surface of the common gate electrode CGE. The source follower gate insulating film 315 may be formed between the common gate electrode CGE and the substrate 100. The source follower gate insulating film 315 contacts the first surface 100*a* of the substrate 100. The source follower gate insulating film 315 may include silicon oxide, silicon oxynitride, silicon nitride, or a high dielectric constant material having a higher dielectric constant than that of silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The first select gate electrode SEL1 may be formed in the active region or in a portion thereof (e.g., the third pixel region PR3). The second select gate electrode SEL2 may be formed in the active region or in a portion thereof (e.g., the fourth pixel region PR4). The first select gate electrode SEL1 and the second select gate electrode SEL2 may be electrically connected to the first contact 370*a* and the third contact 370*c*, respectively.

The first select spacer 340 may be formed on a side surface of the first select gate insulating film 345. The second select spacer 350 may be formed on a side surface of the second select gate insulating film 355. The first select spacer 340 and the second select spacer 350 may include oxide, nitride and/or oxynitride.

The first select gate insulating film 345 may be formed on a bottom surface of the first select gate electrode SEL1. The first select gate insulating film 345 may be formed between the first select gate electrode SEL1 and the substrate 100.

The first select gate insulating film 345 contacts the first surface 100*a* of the substrate 100. The second select gate insulating film 355 may be formed on a bottom surface of the second select gate electrode SEL2. The second select gate insulating film 355 may be formed between the second select gate electrode SEL2 and the substrate 100. The second select gate insulating film 355 contacts the first surface 100*a* of the substrate 100. The first select gate insulating film 345 and the second select gate insulating film 355 may include silicon oxide, silicon oxynitride, silicon nitride, or a high dielectric constant material having a higher dielectric constant than that of silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate, respectively.

The common gate electrode CGE, the first select gate electrode SEL1, the second select gate electrode SEL2, and the reset gate electrode RG are disposed at a same vertical level from the substrate 100.

The fourth transfer gate electrode TG4 may be formed in the active region or in a portion thereof (e.g., the fourth pixel region PR4). The fourth transfer gate electrode TG4 may be electrically connected to the fourth contact 370*d*. A portion of the fourth transfer gate electrode TG4 may be buried in the substrate 100.

The fourth transfer spacer 360 may be formed on the side surface of the fourth transfer gate insulating film 365. The fourth transfer spacer 360 may include oxide, nitride and/or oxynitride.

The fourth transfer gate insulating film 365 may be formed on a bottom surface of the fourth transfer gate electrode TG4 and a portion of side surface of the fourth transfer gate electrode TG4. The fourth transfer gate insulating film 365 wraps the fourth transfer gate electrode TG4 buried in the substrate 100. The fourth transfer gate insulating film 365 may include silicon oxide, silicon oxynitride, silicon nitride, or a high dielectric constant material having a higher dielectric constant than that of silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

In some embodiments, the first node ND1 may be disposed between the first select transistor SX1 and the first source follower transistor SF1. The first node ND1 may be disposed between the first select gate electrode SEL1 and the common gate electrode CGE. The first node ND1 may be a source/drain region of the first select transistor SX1 and a source/drain region of the first source follower transistor SF1. The first node ND1 may be buried under the first surface 100*a* of the substrate 100. The first node ND1 may be formed in the third pixel region PR3.

The second node ND2 is disposed between the second select transistor SX2 and the second source follower transistor SF2. The second node ND2 is disposed between the second select gate electrode SEL2 and the common gate electrode CGE. The second node ND2 may be a source/drain region of the second select transistor SX2 and a source/drain region of the second source follower transistor SF2. The second node ND2 may be buried under the first surface 100a of the substrate 100. The second node ND2 may be formed in the fourth pixel region PR4. The first node ND1 may be overlap the second node ND2 in the first direction X.

The third node ND3 may be disposed on one side of the second source follower transistor SF2. The third node ND3 may be disposed between the fourth floating diffusion node FG4 and the common gate electrode CGE. The third node ND3 may be a source/drain region of the second source follower transistor SF2. The third node ND3 may be buried under the first surface 100a of the substrate 100. The third node ND3 may be formed in the fourth pixel region PR4. The third node ND3 may not overlap the first node ND1 and the second node ND2 in the first direction X.

The fourth node ND4 may be disposed on one side of the second select transistor SX2. The fourth node ND4 may be disposed on one side the second select gate electrode SEL2. The fourth node ND4 may be a source/drain region of the second select transistor SX2. The fourth node ND4 may be buried under the first surface 100a of the substrate 100. The fourth node ND4 may be formed in the fourth pixel region PR4. The fourth node ND4 may not overlap the first node ND1 and the second node ND2 in the first direction X. The fourth node ND4 may overlap the third node ND3 in the first direction X.

In some embodiments, source/drain regions of the transistors may be not arranged in a straight line. With respect to the transistors, the source/drain regions may be arranged at 90 degrees. However, the technical spirit of the present disclosure is not limited thereto.

Although not shown, a plurality of nodes may be disposed around the reset gate electrode RG, first select gate electrode SEL1, and third floating diffusion node FD3.

The first interlayer insulating layer 320 may be formed on the first surface 100a of the substrate 100. The first interlayer insulating layer 320 may be formed on the active region and the device isolation layer 130.

The first interlayer insulating layer 320 may be formed on the first select gate electrode SEL1, the first select gate insulating film 345, the first select spacer 340, the second select gate electrode SEL2, the second select gate insulating film 355, the second select spacer 350, the common gate electrode CGE, the source follower gate insulating film 315, the source follower spacer 310, the fourth transfer gate electrode TG4, the fourth transfer gate insulating film 365 and the fourth transfer spacer 360.

The first interlayer insulating layer 320 may include at least one of an oxide film, a nitride film and an oxynitride film.

The first contact 370a may be connected to the first select gate electrode SEL1. The second contact 360b may be connected to the common gate electrode CGE. The third contact 370c may be connected to the second select gate electrode SEL2. The fourth contact 370d may be connected to the fourth transfer gate electrode TG4. The first contact 370a, the second contact 370b, the third contact 370c, and the fourth contact 370d may be formed through the first interlayer insulating layer 320.

The second interlayer insulating layer 330 may be formed on the first interlayer insulating layer 320. The second interlayer insulating layer 330 may include at least one of an oxide film, a nitride film and an oxynitride film. The first wiring 300 and the second wiring 200 of FIG. 4 may be formed in the second interlayer insulating layer 330. The first wiring 300 may be in contact with the second contact 370b and the second wiring 200 may be in contact with the first contact 370a and the third contact 370d.

In the image sensor according to the present embodiments, the common gate electrode CGE may be formed over the two pixel regions in the share pixel. Accordingly, noise can be reduced by increasing the area of the common gate electrode CGE.

Further, rather than a case where there are a plurality of common gate electrodes CGE and they are connected at the upper level by wiring, only one common gate electrode can be used, and a structure for the upper wiring is not required. Accordingly, a space margin of the entire image sensor device can be ensured. Thus, it is possible to broaden the range of choices for determining the width and length of other components in layout design.

Hereinafter, an image sensor according to some embodiments of the present disclosure will be described with reference to FIGS. 6 to 9. A repeated description of the above-mentioned embodiment is simplified or omitted.

Figure 6:
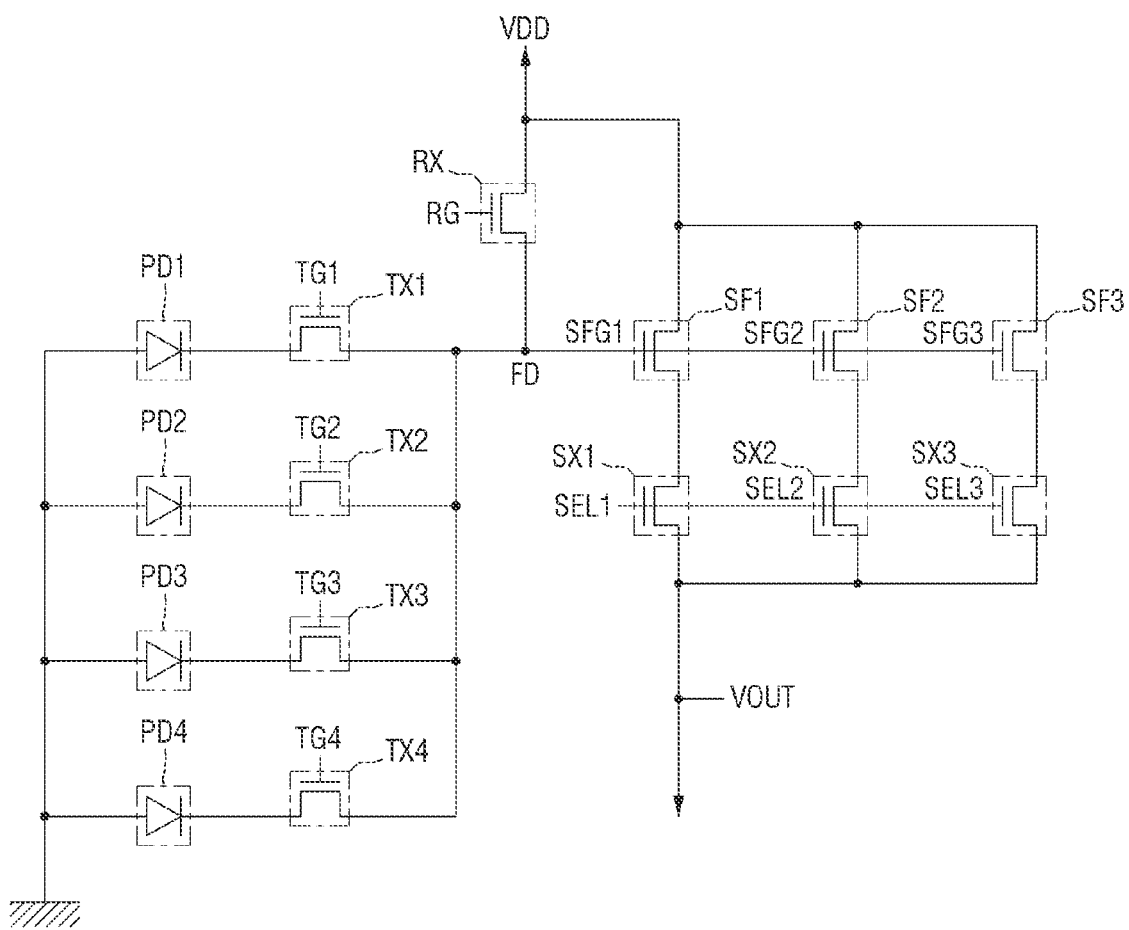
FIG. 6 is an equivalent circuit diagram of share pixels of an image sensor according to some embodiments of the present disclosure.

FIG. 6 is an equivalent circuit diagram of share pixels of an image sensor according to some embodiments of the present disclosure. FIG. 6 is an equivalent circuit diagram of the first share pixel SP1 of FIG. 2.

Referring to FIG. 6, an image sensor according to some embodiments of the present disclosure includes a third source follower transistor SF3 and a third select transistor SX3.

The third source follower transistor SF3 may include a third source follower gate electrode SFG3. The third source follower transistor SF3, the second source follower transistor SF2, and the first source follower transistor SF1 share a gate electrode. Thus, a gate electrode of the third source follower transistor SF3, a gate electrode of the second source follower transistor SF2, and a gate electrode of the first source follower transistor SF1 are same.

The third select transistor SX3, in cooperation with the first select transistor SX1 and the second select transistor SX2, may select a pixel to be read on a row basis. As the more select transistors are arranged in parallel, a faster reaction can be achieved.

The third select transistor SX3 may be connected in series with the third source follower gate electrode SFG3 and may be connected in parallel with the first select transistor SX1 and the second select transistor SX2.

Figure 7A:
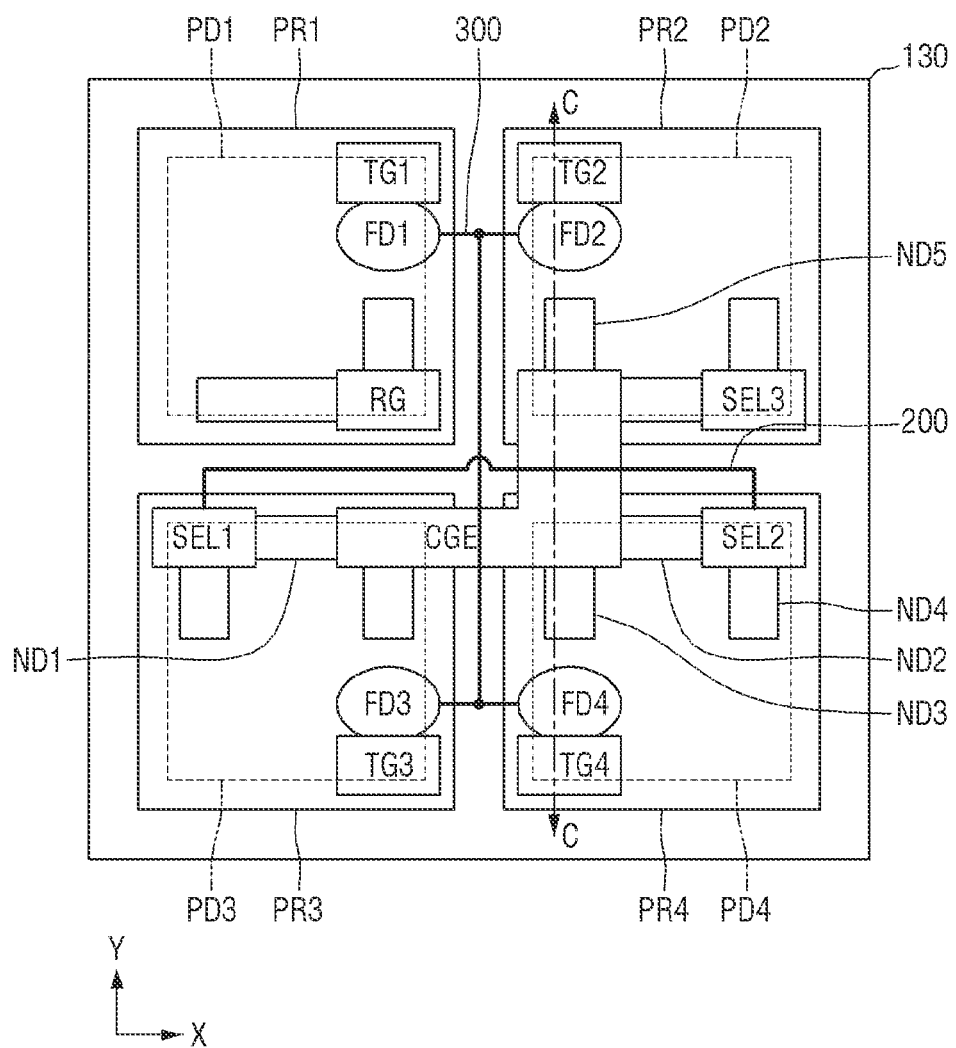
FIGS. 7A and 7B are layout diagrams of share pixels of an image sensor according to some embodiments of the present disclosure.
Figure 7B:
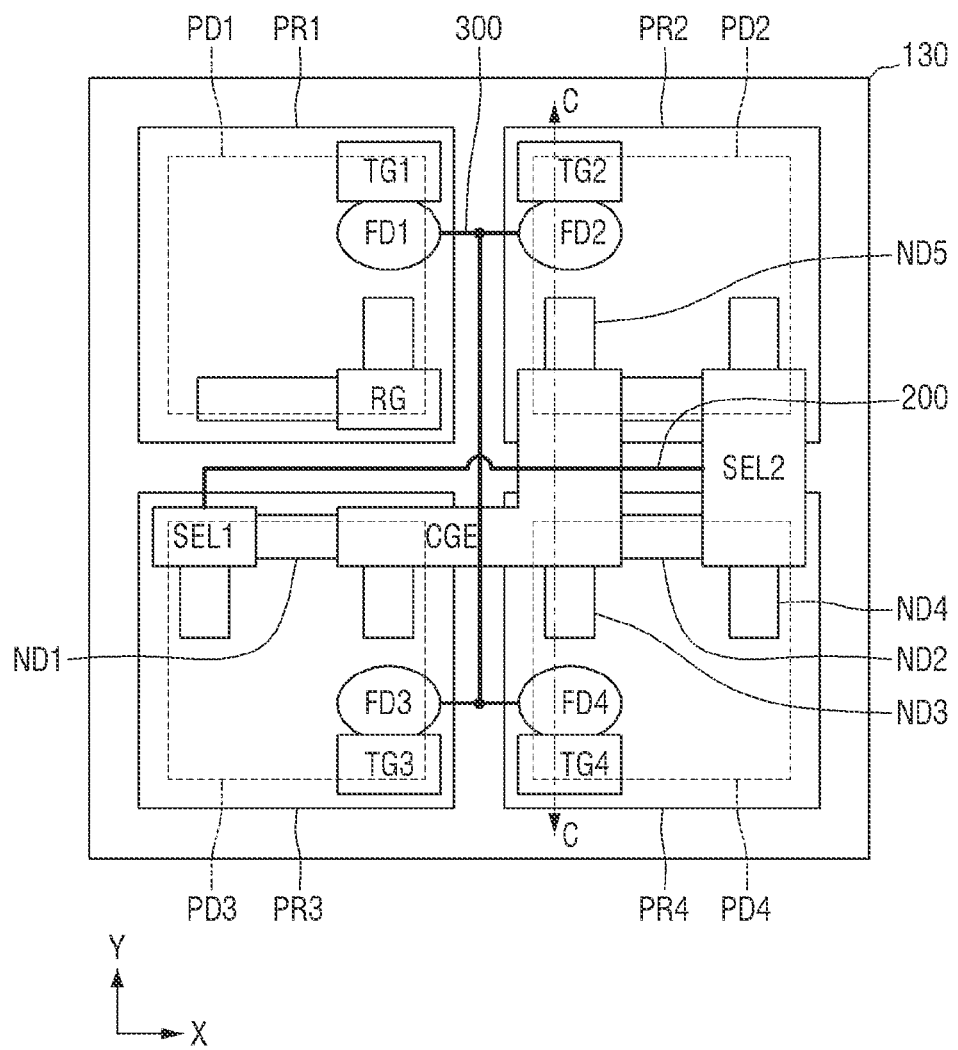
Figure 8:
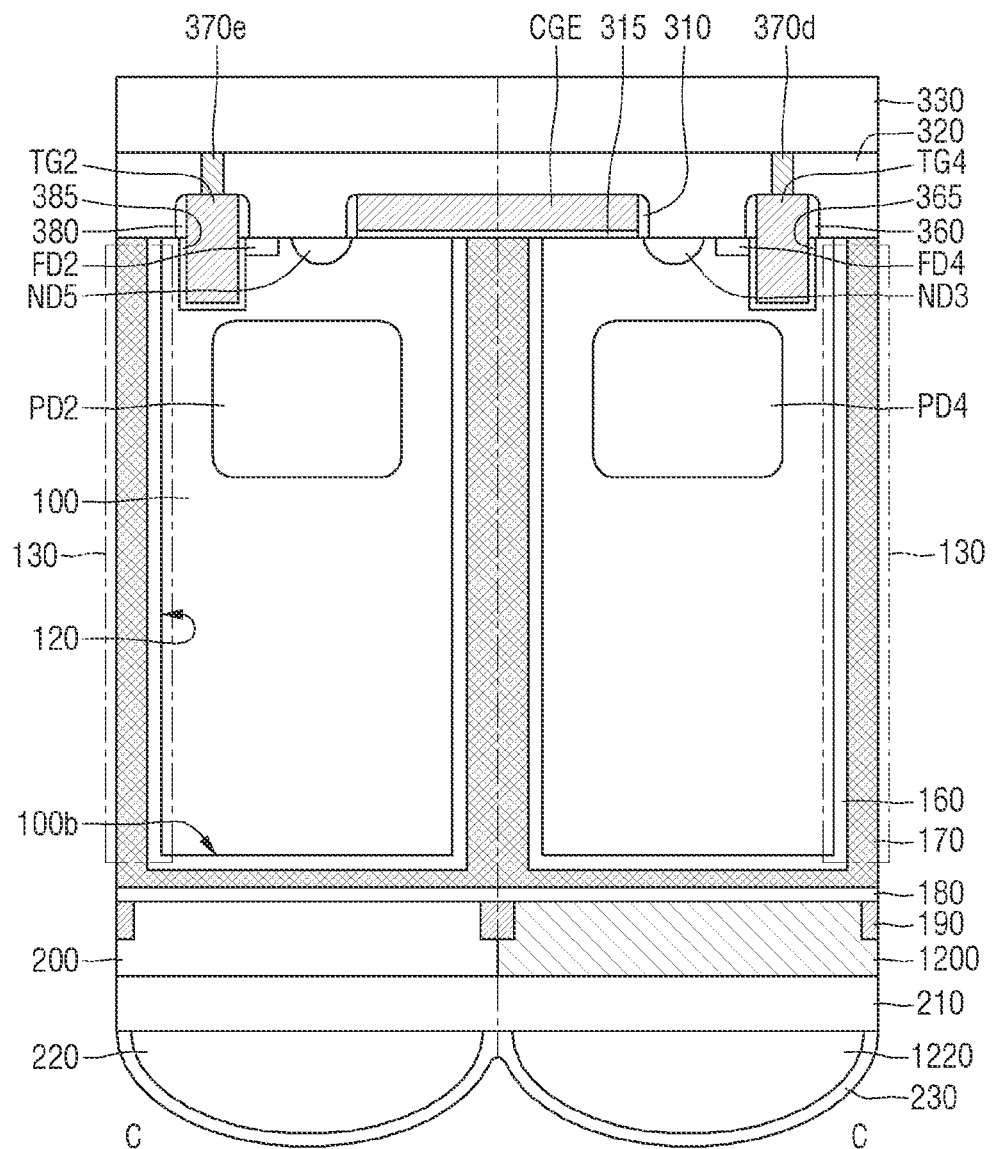
FIG. 8 is a cross-sectional view taken along line C-C of FIG. 7A.
Figure 9:
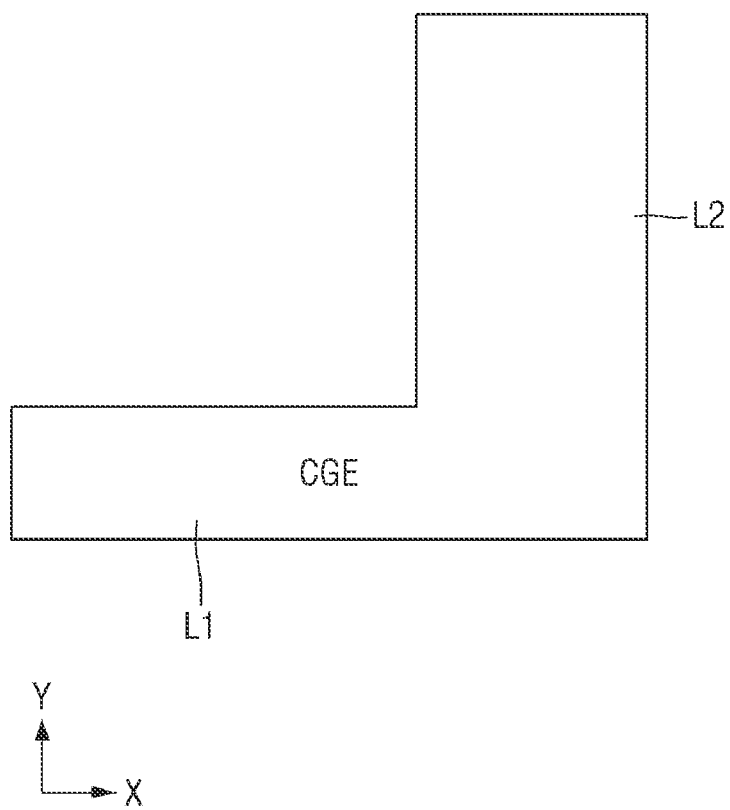
FIG. 9 is a plan view illustrating a shape of a common gate electrode of FIG. 7A.

FIGS. 7A and 7B is a layout diagram of share pixels of an image sensor according to some embodiments of the present disclosure. FIG. 8 is a cross-sectional view taken along line C-C of FIG. 7A. FIG. 9 is a plan view illustrating a shape of a common gate electrode of FIG. 7A.

Referring to FIGS. 7A, 7B and 9, a common gate electrode CGE may be formed over the second pixel region PR2, the third pixel region PR3 and the fourth pixel region PR4. The common gate electrode CGE may be a gate electrode of the first source follower transistor SF1, the second source follower transistor SF2, and the third source follower transistor SF3. The common gate electrode CGE may include a first source follower gate electrode SFG1, the second source follower gate electrode SFG2, and the third source follower gate electrode SFG3. That is, the common gate CGE may include a first portion L1 extending in a first direction X and a second portion L2 extending in a second direction Y.

Accordingly, the common gate electrode CGE is formed on the device isolation layer 130 between the third pixel region PR3 and the fourth pixel region PR4, and on the device isolation layer 130 between the second pixel region PR2 and the fourth pixel region PR4.

In some embodiments, the image sensor further comprises a second transfer gate electrode TG2, a second transfer gate insulating film 385, a second gate spacer 380, a fifth node ND5, and a fifth contact 370e.

The second transfer gate electrode TG2 may be formed in the active region or in a portion thereof (e.g., the second pixel region PR2). The second transfer gate electrode TG2 may be electrically connected to the fifth contact 370e. A portion of the second transfer gate electrode TG2 may be buried in the substrate 100.

The second transfer spacer 380 may be formed on a side surface of the second transfer gate insulating film 385. The second transfer spacer 380 may include oxide, nitride and/or oxynitride.

The second transfer gate insulating film 385 may be formed on a bottom surface of the second transfer gate electrode TG2 and a portion of side surface of the second transfer gate electrode TG2. The second transfer gate insulating film 385 wraps the second transfer gate electrode TG2 buried in the substrate 100. The second transfer gate insulating film 385 may include silicon oxide, silicon oxynitride, silicon nitride, or a high dielectric constant material having a higher dielectric constant than that of silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The fifth node ND5 may be disposed between the third source follower transistor SF3 and the second floating diffusion node FD2. The fifth node ND5 may be disposed between the second floating diffusion node FD2 and the common gate electrode CGE. The fifth node ND5 may be a source/drain region of the third source follower transistor SF3. The fifth node ND5 may be buried under the first surface 100a of the substrate 100. The fifth node ND5 may be formed in the second pixel region PR2.

The fifth contact 370e may be connected to the second transfer gate electrode TG2. The fifth contact 370e may be formed through the first interlayer insulating layer 320.

Since the common gate electrode CGE has a wider area, the noise of the signal can be minimized. Furthermore, since the area of the metal of first to fourth floating diffusion regions FD1 to FD4 is relatively smaller, a coupling effect of the parasitic capacitance can be suppressed.

Referring to FIG. 7B, the second select gate electrode SEL2 is formed on the second pixel region PR2. The second select gate electrode SEL2 is extended in the second direction Y. The second select gate electrode SEL2 may be disposed on the device isolation layer 130.

Hereinafter, an image sensor according to some embodiments of the present disclosure will be described with reference to FIG. 10. A repeated description of the above-mentioned embodiment is simplified or omitted.

Figure 10:
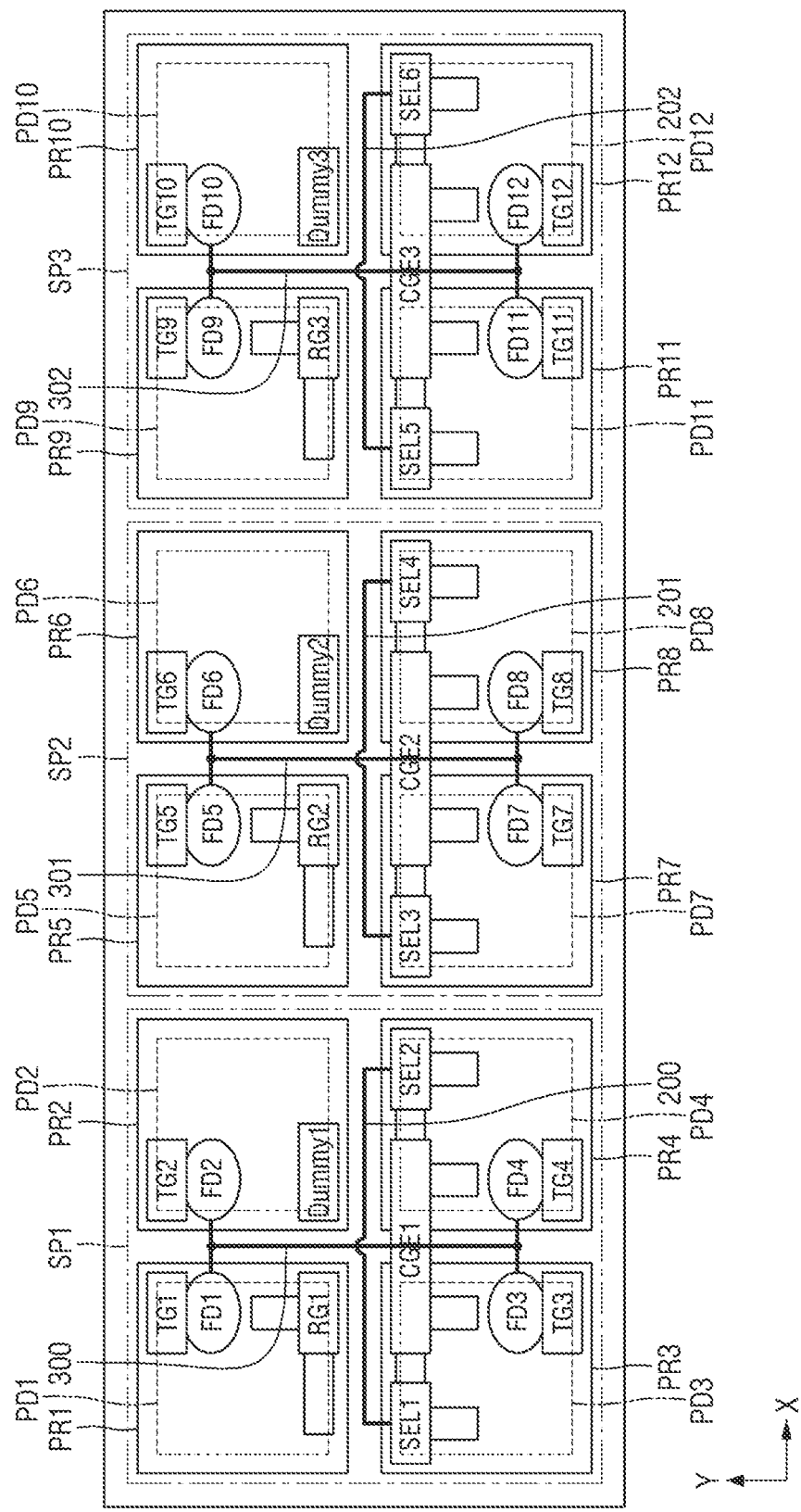
FIG. 10 is a layout diagram of share pixels of an image sensor according to some embodiments of the present disclosure.

FIG. 10 is a layout diagram of share pixels of an image sensor according to some embodiments of the present disclosure.

Referring to FIG. 10, an image sensor according to some embodiments of the present disclosure includes a first share pixel SP1, a second share pixel SP2 and a third share pixel SP3. The first share pixel SP1, the second share pixel SP2 and the third share pixel SP3 may be separated from each other by a device isolation layer 130.

The first share pixel SP1, the second share pixel SP2 and the third share pixel SP3 may be sequentially arranged in the first direction X. The second share pixel SP2 includes fifth to eighth pixels P5 to P8. The fifth to eighth pixels P5 to P8 may include a fifth pixel region PR5, a sixth pixel region PR6, a seventh pixel region PR7 and an eighth pixel region PR8, respectively. The fifth pixel region P5, the sixth pixel region P6, the seventh pixel region P7 and the eighth pixel region P8 may be separated from each other by the device isolation layer 130.

The fifth pixel region PR5 and the sixth pixel region PR6 are aligned with each other in the first direction X, and the seventh pixel region PR7 and the eighth pixel region PR8 are aligned with each other in the first direction X. The fifth pixel region PR5 and the seventh pixel region PR7 are aligned with each other in the second direction Y, and the sixth pixel region PR6 and the eighth pixel region PR8 are aligned with each other in the second direction Y.

A ninth pixel region PR9 and a tenth pixel region PR10 are aligned with each other in the first direction X, and an eleventh pixel region PR11 and a twelfth pixel region PR12 are aligned with each other in the first direction X. The ninth pixel region PR9 and the eleventh pixel region PR11 are aligned with each other in the second direction Y, and the tenth pixel region PR10 and the twelfth pixel region PR12 are aligned with each other in the second direction Y.

A fifth transfer gate electrode TG5 may be located in the fifth pixel region PR5, and a sixth transfer gate electrode TG6 may be located in the sixth pixel region PR6. A seventh transfer gate electrode TG7 may be located in the seventh pixel region PR7 and an eighth transfer gate electrode TG8 may be located in the eighth pixel region PR8.

A ninth transfer gate electrode TG9 may be located in the ninth pixel region PR9, and a tenth transfer gate electrode TG10 may be located in the tenth pixel region PR10. An eleventh transfer gate electrode TG11 may be located in the eleventh pixel region PR11, and a twelfth transfer gate electrode TG12 may be located in the twelfth pixel region PR12.

Fifth to eighth floating diffusion nodes FD5 to FD8 are disposed in the fifth pixel region PR5, the sixth pixel region PR6, the seventh pixel region PR7 and the eighth pixel region PR8, respectively. The fifth to eighth floating diffusion nodes FD5 to FD8 may be connected to each other. The fifth to eighth floating diffusion nodes FD5 to FD8 may be coupled to the fifth to eighth transfer gates TG5 to TG8, respectively.

Ninth to twelfth floating diffusion nodes FD9 to FD12 may be disposed in the ninth pixel region PR9, the tenth pixel region PR10, the eleventh pixel region PR11 and the twelfth pixel region PR12, respectively. The ninth to twelfth floating diffusion nodes FD9 to FD12 may be connected to each other. The ninth to twelfth floating diffusion nodes FD9 to FD12 may be coupled to the ninth to twelfth transfer gates TG9 to TG12, respectively.

A first reset gate electrode RG1 may be located in the first pixel region PR1. The first reset gate electrode RG1 may be configured to reset the first to fourth floating diffusion nodes FD1 to FD4. A second reset gate electrode RG2 may be located in the fifth pixel region PR5. The second reset gate electrode RG2 may be configured to reset the fifth to eighth floating diffusion nodes FD5 to FD8. A third reset gate electrode RG3 may be located in the ninth pixel region PR9. The third reset gate electrode RG3 may be configured to reset the ninth to twelfth floating diffusion nodes FD9 to FD12.

A first dummy gate electrode Dummy1 may be located in the second pixel region PR2. A second dummy gate electrode Dummy2 may be located in the fifth pixel region PR5. A third dummy gate electrode Dummy3 may be located in the ninth pixel region PR9.

A first common gate electrode CGE1 may be formed over the third pixel region PR3 and the fourth pixel region PR4. A second common gate electrode CGE2 may be formed over the seventh pixel region PR7 and the eighth pixel region PR8. A third common gate electrode CGE3 may be formed over the eleventh pixel region PR11 and the twelfth pixel region PR12. The first common gate electrode CGE1, the second common gate electrode CGE2 and the third common gate electrode CGE3 may also be formed on the device isolation layer 130.

A third select gate electrode SEL3 may be located in the seventh pixel region PR7, and a fourth select gate electrode SEL4 may be located in the eighth pixel region PR8. A fifth select gate electrode SEL5 may be located in the eleventh pixel region PR11 and a sixth select gate electrode SEL6 may be located in the twelfth pixel region PR12.

A third wiring 301 may connect the fifth floating diffusion node FD5, the sixth floating diffusion node FD6, the seventh floating diffusion node FD7 and the eighth floating diffusion node FD8 to the first common gate electrode CGE1. A fourth wiring 302 may connect the ninth floating diffusion node FD9, the tenth floating diffusion node FD10, the eleventh floating diffusion node FD11 and the twelfth floating diffusion node FD12 to the second common gate electrode CGE2.

A fifth wiring 201 may connect the third select gate electrode SEL3 and the fourth select gate electrode SEL4. Accordingly, the third select gate electrode SEL3 and the fourth select gate electrode SEL4 can be controlled with the same gate voltage.

A sixth wiring 202 may connect the fifth select gate electrode SEL5 and the sixth select gate electrode SEL6. Accordingly, the fifth select gate electrode SEL5 and the sixth select gate electrode SEL6 can be controlled with the same gate voltage.

Hereinafter, an image sensor according to some embodiments of the present disclosure will be described with reference to FIG. 11. A repeated description of the above-mentioned embodiment is simplified or omitted.

Figure 11:
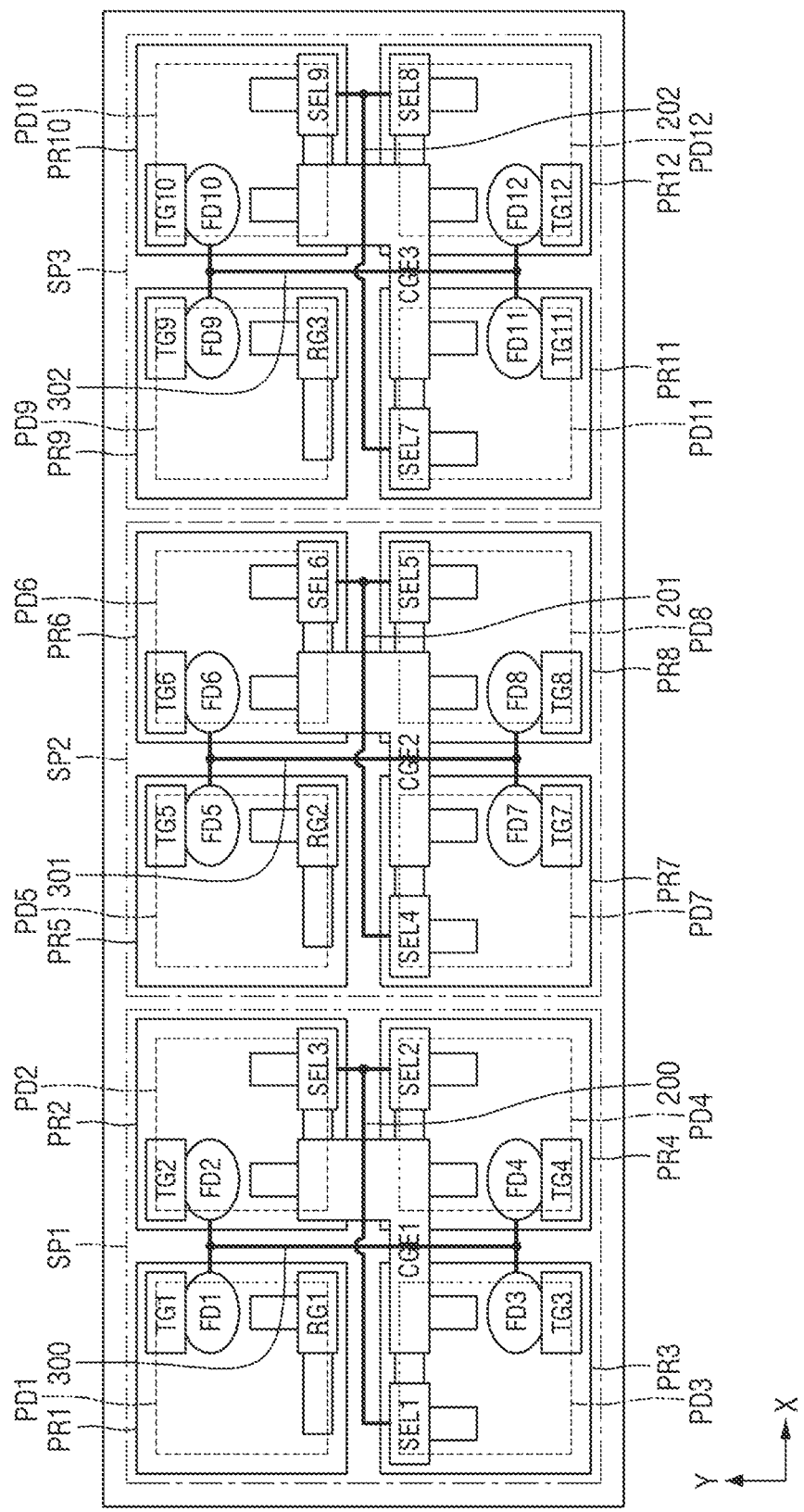
FIG. 11 is a layout diagram of share pixels of an image sensor according to some embodiments of the present disclosure.

FIG. 11 is a layout diagram of share pixels of an image sensor according to some embodiments of the present disclosure.

Referring to FIG. 11, an image sensor according to some embodiments of the present disclosure further includes a seventh select gate electrode SEL7, an eighth select gate electrode SEL8, and a ninth select gate electrode SEL9.

The first common gate electrode CGE1 may be formed over the second pixel region PR2, the third pixel region PR3 and the fourth pixel region PR4. The second common gate electrode CGE2 may be formed over the sixth pixel region PR6, the seventh pixel region PR7 and the eighth pixel region PR8. The third common gate electrode CGE3 may be formed over the tenth pixel region PR10, the eleventh pixel region PR11 and the twelfth pixel region PR12.

In FIG. 11, the third select gate electrode SEL3 may be disposed in the second pixel region PR2. The sixth select gate electrode SEL6 may be disposed in the second pixel region PR6. The seventh select gate electrode SEL7 may be disposed in the eleventh pixel region PR11. The eighth select gate electrode SEL8 may be disposed in the twelfth pixel region PR12.

Hereinafter, an image sensor according to some embodiments of the present disclosure will be described with reference to FIGS. 12 and 13. A repeated description of the above-mentioned embodiment is simplified or omitted.

Figure 12:
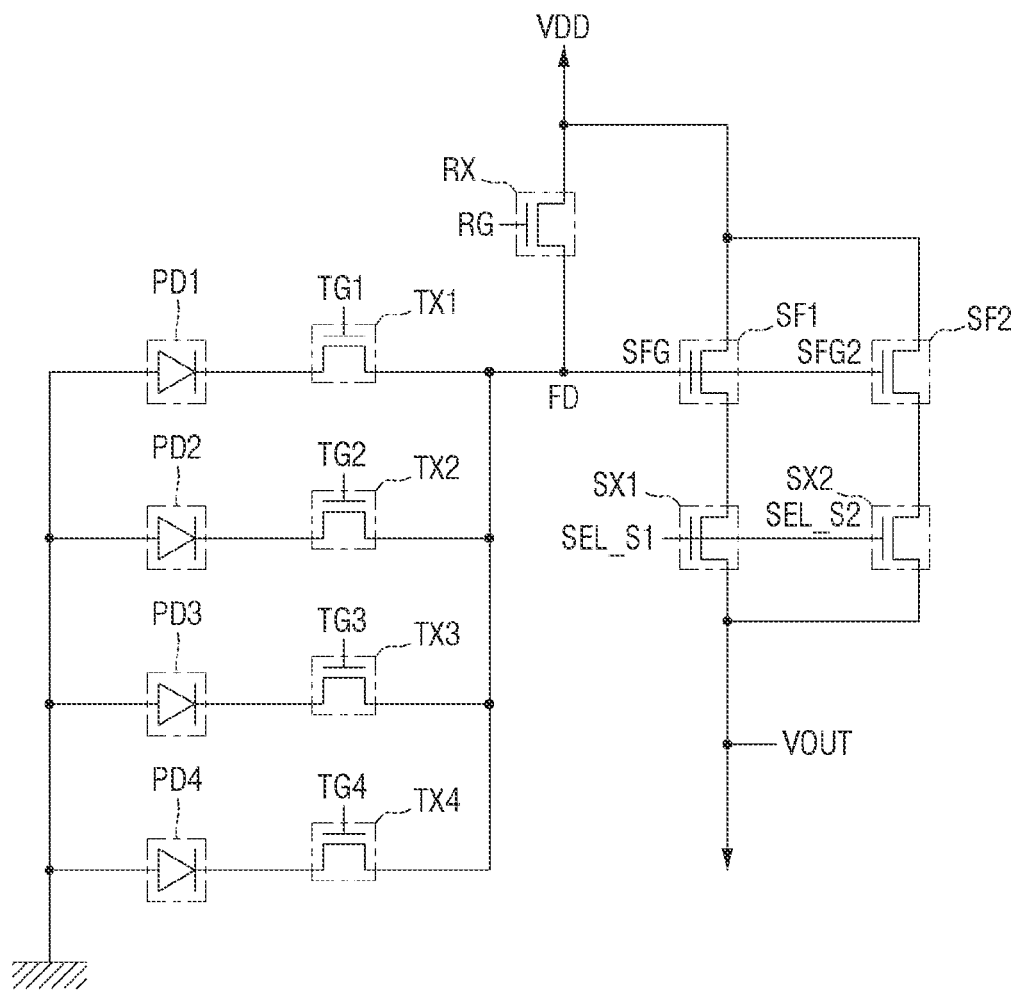
FIG. 12 is an equivalent circuit diagram of share pixels of an image sensor according to some embodiments of the present disclosure.

FIG. 12 is an equivalent circuit diagram of share pixels of an image sensor according to some embodiments of the present disclosure. FIG. 13 is a layout diagram of share pixels of an image sensor according to some embodiments of the present disclosure. FIG. 12 is an equivalent circuit diagram for the first share pixel SP1 of FIG. 13 for convenience. The equivalent circuit of the second share pixel SP2 and the third share pixel SP3 is substantially the same as that of FIG. 13.

Figure 13:
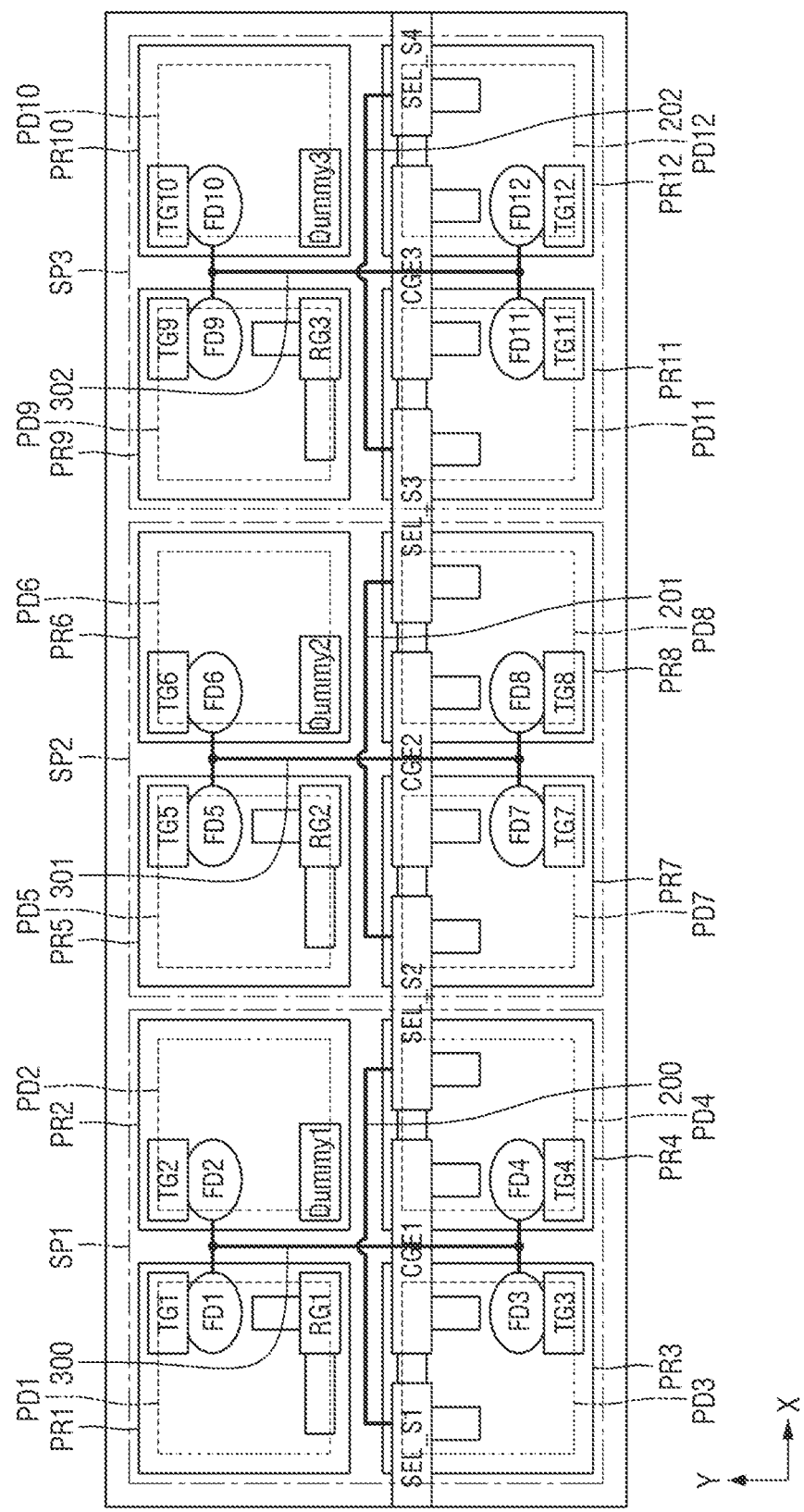
FIG. 13 is a layout diagram of share pixels of an image sensor according to some embodiments of the present disclosure.

Referring to FIGS. 12 and 13, an image sensor according to embodiments of the present disclosure includes a first source follower transistor SF1, a second source follower transistor SF2, a first select transistor SX1, and a second select transistor SX2.

The first source follower transistor SF1 includes a first source follower gate electrode SFG1. The second source follower transistor SF2 includes a second source follower gate electrode SFG2. The first select transistor SX1 includes a first select gate electrode SEL_S1 and the second select transistor SX2 includes a second select gate electrode SEL_S2.

The first select gate electrode SEL_S1 may extend to the share pixel adjacent to the first share pixel SP1 in the first direction X. The second select gate electrode SEL_S2 may be formed over the first share pixel SP1 and the second share pixel SP2. That is, the second select gate electrode SEL_S2 may be formed over the fourth pixel region PR4 and the seventh pixel region PR7.

In FIG. 13, a third select gate electrode SEL_S3 may be formed over the second share pixel SP2 and the third share pixel SP3. The third select gate electrode SEL_S3 may be formed over the eighth pixel region PR8 and the eleventh pixel region PR11. A fourth select gate electrode SEL_S4 may be formed to extend from the twelfth pixel region PR12 to an adjacent share pixel. The first select gate electrode SEL_S1, the second select gate electrode SEL_S2, the third select gate electrode SEL_S3 and the fourth select gate electrode SEL_S4 may also be formed on the device isolation layer 130.

In the image sensor according to the present embodiment, the select gate may also be connected on the device isolation layer to reduce a wiring portion connecting the select gate while achieving a noise reduction effect with an increase in area, thereby improving coupling.

Hereinafter, an image sensor according to some embodiments of the present disclosure will be described with reference to FIGS. 14 and 15. A repeated description of the above-mentioned embodiment is simplified or omitted.

Figure 14:
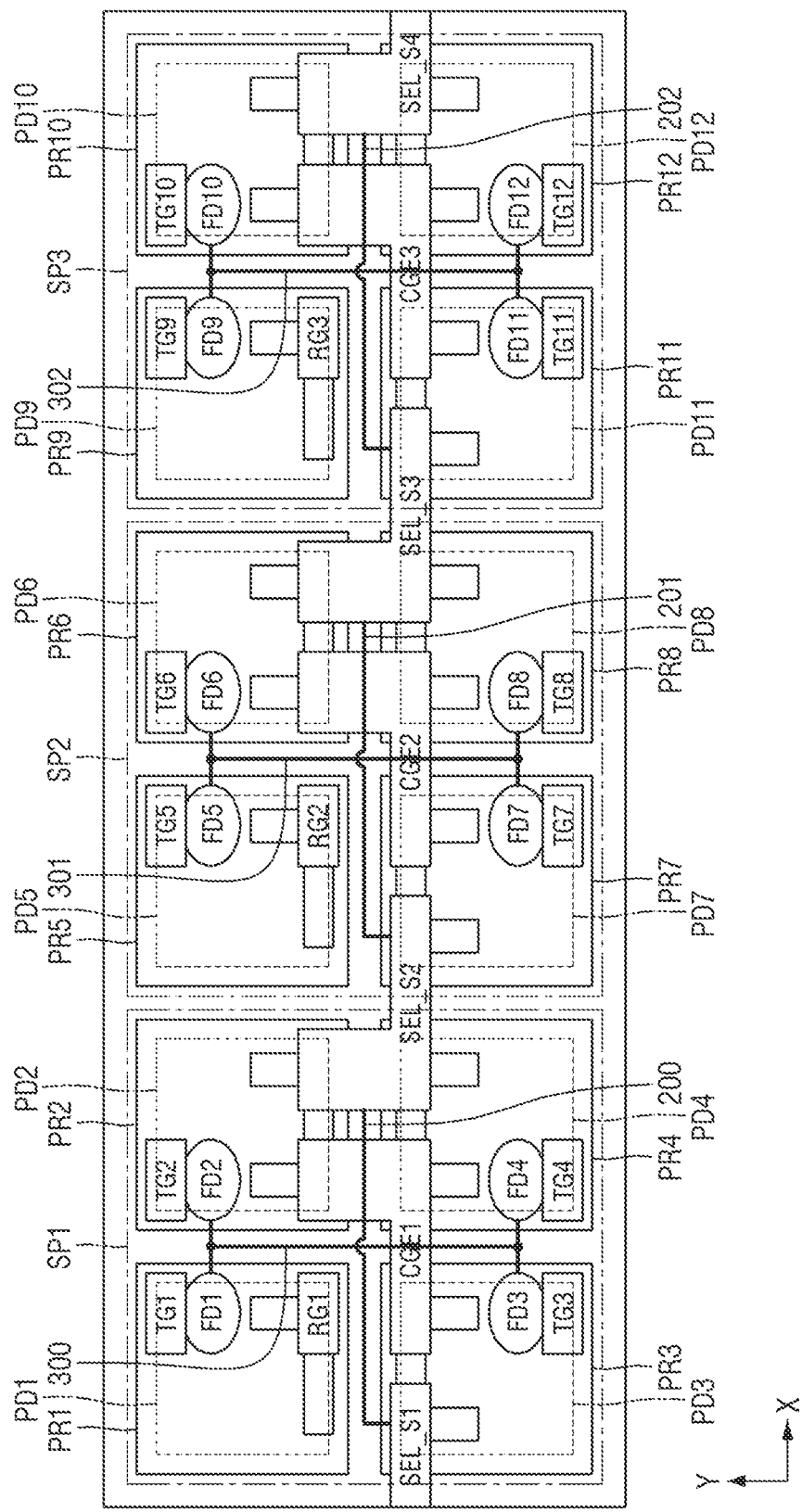
FIG. 14 is a layout diagram of share pixels of an image sensor according to some embodiments of the present disclosure.

FIG. 14 is a layout diagram of share pixels of an image sensor according to some embodiments of the present disclosure. FIG. 15 is a plan view illustrating a shape of a second select gate electrode of FIG. 14. Although FIG. 15 illustrates a shape of the second select gate electrode SEL_S2 for convenience, the shape of the other select gate may be the same as that of the second select gate electrode SEL_S2.

Figure 15:
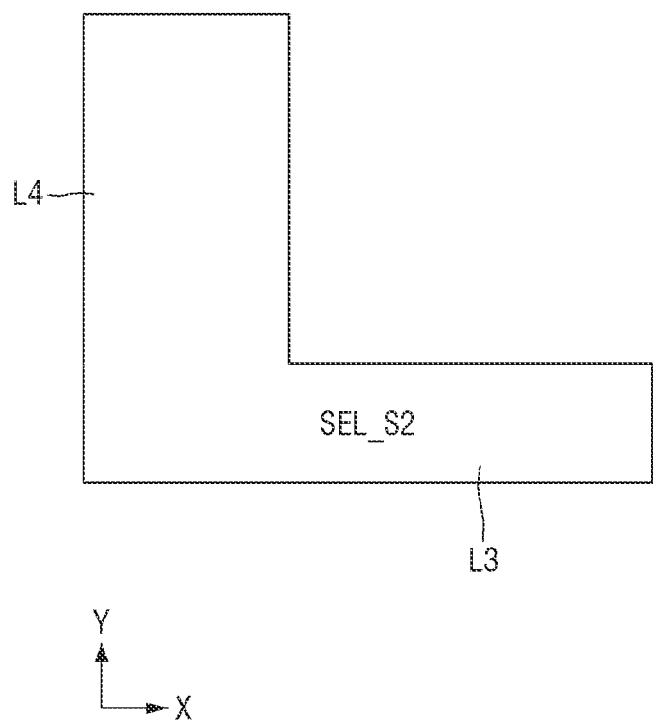
FIG. 15 is a plan view illustrating a shape of a second select gate electrode of FIG. 14.

Referring to FIGS. 14 and 15, the second select gate electrode SEL_S2 extends over the second pixel region PR2 in the second direction Y. The first select gate electrode SEL_S1 may extend to the share pixel adjacent to the first share pixel SP1 in the first direction X. The second select gate electrode SEL_S2 may be formed over the first share pixel SP1 and the second share pixel SP2. That is, the second select gate electrode SEL_S2 may be formed over the second pixel region PR2, the fourth pixel region PR4 and the seventh pixel region PR7.

A third select gate electrode SEL_S3 may be formed over the second share pixel SP2 and the third share pixel SP3. The third select gate electrode SEL_S3 may be formed over the sixth pixel region PR6, the eighth pixel region PR8 and the eleventh pixel region PR11. A fourth select gate electrode SEL_S4 may be formed over the adjacent shared pixels in the tenth pixel region PR10 and the twelfth pixel region PR12. The first select gate electrode SEL_S1, the second select gate electrode SEL_S2, the third select gate electrode SEL_S3 and the fourth select gate electrode SEL_S4 may also be formed on the device isolation layer 130.

The second select gate electrode SEL_S2 may include a third portion L3 extending in the first direction X and a fourth portion L4 extending in the second direction Y.

In the image sensor according to the present embodiment, the select gate may also be connected on the device isolation layer to reduce a wiring portion connecting the select gate while achieving a noise reduction effect with an increase in area, thereby improving coupling.

While the present inventive concepts have been particularly shown and described with reference to exemplary embodiments thereof, it will be understood by those of ordinary skill in the art that various changes in form and details may be made therein without departing from the scope of the present inventive concepts as defined by the following claims. It is therefore desired that the present embodiments be considered in all respects as illustrative and not restrictive, reference being made to the appended claims rather than the foregoing description to indicate the scope of the present disclosure.

What is claimed is:

1. An image sensor comprising:
   a substrate including first and second surfaces opposite to each other;
   a device isolation layer that extends through the substrate and has a surface that is level with the second surface of the substrate;
   an active region comprising first and second pixel regions that are separated from each other by the device isolation layer, and are spaced apart from each other in a first direction;
   a photoelectric device located in the substrate and configured to convert light into electric charges;
   a microlens on the first surface;
   a first select transistor and a first source follower transistor in the first pixel region;
   a second source follower transistor in the second pixel region;
   a first node between the first select transistor and the first source follower transistor on the first pixel region; and
   a second node on one side of the first select transistor on the first pixel region,
   wherein the first and second source follower transistor have a common gate electrode that extends over the device isolation layer and the first and the second pixel regions,
   wherein the first node is a source/drain region of the first select transistor and the first source follower transistor,
   wherein the second node is a source/drain region of the first select transistor, and
   wherein the second node does not overlap with the first node in the first direction.

2. The image sensor of claim 1, wherein a gate electrode of the first select transistor and the common gate electrode are at a same vertical level from the substrate.

3. The image sensor of claim 1, further comprising:
   a third pixel region spaced apart from the first pixel region in a second direction that intersects the first direction; and
   a reset transistor in the third pixel region and symmetrically located with a portion of the first source follower transistor.

4. The image sensor of claim 1, further comprising:
   an interlayer insulating layer on the active region and the device isolation layer; and
   a first wiring in the interlayer insulating layer that connects floating diffusion nodes to each other,
   wherein the first wiring is at an upper level that is higher than the common gate electrode.

5. The image sensor of claim 4, wherein the first wiring is connected to the common gate electrode.

6. The image sensor of claim 4, further comprising:
   a second wiring in the interlayer insulating layer that connects to a gate electrode of the first select transistor,
   wherein the second wiring is at the upper level that is higher than the common gate electrode.

7. The image sensor of claim 1, further comprising
   a third node on one side of the first source follower transistor on the first pixel region,
   wherein the third node is a source/drain region of the first source follower transistor,
   wherein the third node overlaps the second node in the first direction, and
   wherein the third node does not overlap the first node in the first direction.

8. An image sensor comprising:
   a substrate including first and second surfaces opposite to each other;
   a device isolation layer that extends through the substrate and has a surface that is level with the second surface of the substrate;
   an active region comprising first to fourth pixel regions separated from each other by the device isolation layer, wherein the first pixel region is spaced apart from the second pixel region in a first direction, and wherein the first pixel region is spaced apart from the third pixel region in a second direction;
   a microlens on the first surface;
   a first select transistor and a first source follower transistor on the third pixel region;
   a second source follower transistor on the fourth pixel region;
   a third source follower transistor on the second pixel region;
   a first node between the first select transistor and the first source follower transistor on the third pixel region; and
   a second node on one side of the first select transistor on the third pixel region;
   wherein each of the first to fourth pixel regions have a respective one of first to fourth photoelectric devices located in the substrate and configured to convert light into electric charges, and a respective one of first to fourth transfer transistors on the second surface of the substrate, each of the first to fourth transfer transistors configured to transfer the electric charges to a respective one of first to fourth floating diffusion nodes,
   wherein the first source follower transistor, the second source follower transistor and the third source follower transistor have a common gate electrode, wherein the common gate electrode has a first portion that extends over the device isolation layer and the third pixel region and the fourth pixel region, and a second portion that extends over the device isolation layer and the fourth pixel region and the second pixel region, wherein the first node is a source/drain region of the first select transistor and the first source follower transistor, wherein the second node is a source/drain region of the first select transistor, and wherein the first node does not overlap the second node in the first direction.

9. The image sensor of claim 8, further comprising a reset transistor in the first pixel region and symmetrically located with a portion of the first source follower transistor.

10. The image sensor of claim 9, wherein a gate electrode of the reset transistor, a gate electrode of the first select transistor, and the common gate electrode are at a same vertical level from the substrate.

11. The image sensor of claim 8, further comprising:
a third node between the first source follower transistor and the third floating diffusion node on the third pixel region,
wherein the third node is a source/drain region of the first source follower transistor,
wherein the third node overlaps the second node in the first direction, and
wherein the third node does not overlap the first node in the first direction.

12. The image sensor of claim 8, further comprising:
a second select transistor on the fourth pixel region; and
a third select transistor on the second pixel region.

13. The image sensor of claim 12, wherein a gate electrode of the second select transistor and a gate electrode of the third select transistor is shared.

14. The image sensor of claim 12, further comprising:
a third node between the second source follower transistor and the second select transistor on the fourth pixel region,
wherein the third node is a source/drain region of the second source follower transistor and the second select transistor, and
wherein the third node overlaps the first node in the first direction.

15. The image sensor of claim 14, further comprising:
a fourth node on one side of the second select transistor on the fourth pixel region,
wherein the fourth node is a source/drain region of the second select transistor, and
wherein the fourth node does not overlap the third node.

16. The image sensor of claim 8, further comprising:
an interlayer insulating layer on the active region and the device isolation layer; and
a first wiring in the interlayer insulating layer that connects the first to fourth floating diffusion nodes to each other,
wherein the first wiring is at an upper level that is higher than the common gate electrode.

17. The image sensor of claim 8, further comprising a dummy gate electrode formed on the second pixel region.

* * * * *